(12) United States Patent
Ohsaki et al.

(10) Patent No.: US 6,230,115 B1
(45) Date of Patent: May 8, 2001

(54) SIMULATOR, SIMULATION METHOD, AND MEDIUM HAVING SIMULATION PROGRAM RECORDED, TAKING ACCOUNT OF TIMING IN ELECTRONIC COMPONENT AND SIGNAL TRANSMISSION THROUGH TRANSMISSION LINE ON PRINTED-CIRCUIT BOARD

(75) Inventors: Hidefumi Ohsaki; Yoshiki Nakamura; Yoshifumi Sasaki; Tomoo Ishida; Yasunori Shibayama, all of Hyogo (JP)

(73) Assignees: Mitsubishi Denki Kabushiki Kaisha, Tokyo; Mitsubishi Electric System LSI Design Corporation, Hyogo, both of (JP)

( * ) Notice: Subject to any disclaimer, the term of this patent is extended or adjusted under 35 U.S.C. 154(b) by 0 days.

(21) Appl. No.: 09/210,820

(22) Filed: Dec. 15, 1998

(30) Foreign Application Priority Data

Jul. 13, 1998 (JP) .................................................. 10-197611

(51) Int. Cl.[7] ........................................................ G06F 17/50
(52) U.S. Cl. ................................... 703/19; 703/15; 703/21
(58) Field of Search ................................ 703/14, 15, 21, 703/19

(56) References Cited

U.S. PATENT DOCUMENTS

| | | | |
|---|---|---|---|
| 4,996,659 | * | 2/1991 | Yamaguchi et al. ................ 714/736 |
| 5,025,402 | * | 6/1991 | Winkelstein ............................ 703/14 |
| 5,535,223 | * | 7/1996 | Horstmann et al. .................. 714/744 |
| 5,894,421 | * | 4/1999 | Yamaguchi et al. ..................... 716/6 |
| 5,974,247 | * | 10/1999 | Yonezawa .............................. 703/19 |

OTHER PUBLICATIONS

Chowdhury, S. et al., "Analysis and Simulation of Interconnects in High–Speed Intergrated Circuits," IEEE Int'l Symp. on Circuits and Systems, Jun. 1991, pp. 2379–2382.*

Brocco, Lynne et al., "Macromodeling CMOS Circuits for Timing Simulation," Computer–Aided Design of Integrated Circuits and System, vol. 7, No. 12, Dec. 1988, pp. 1237–1249.*

\* cited by examiner

Primary Examiner—Eric W. Stamber
Assistant Examiner—Kyle J. Choi
(74) Attorney, Agent, or Firm—McDermott, Will & Emery

(57) ABSTRACT

A simulator includes a timing simulation section executing timing simulation for a logic circuit of an electronic component, a time management section extracting logical operation time at an output terminal of the electronic component from a result of the simulation, a transmission line simulation section executing simulation of a transmission line connected to the output terminal from the logical operation time extracted by the time management section, and a simulation result processing section combining the result of the simulation by the timing simulation section and a result of the transmission line simulation by the transmission line simulation section.

17 Claims, 20 Drawing Sheets

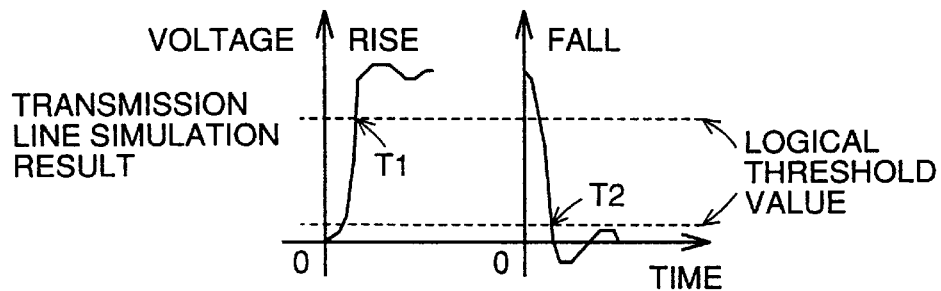
FIG.8A  FIG.8B
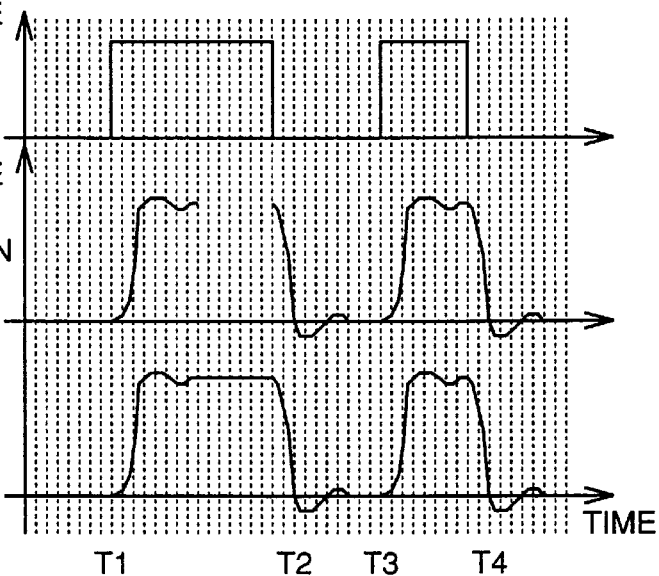

FIG. 14A  LOGICAL VALUE
TIMING SIMULATION RESULT
LOGICAL OPERATION VOLTAGE TIME (TIMING SIMULATION)

FIG. 14B  TRANSMISSION LINE SIMULATION RESULT
LOGICAL OPERATION TIME (TRANSMISSION LINE SIMULATION)

FIG. 14C  INPUT WAVEFORM FOR TIMING SIMULATION

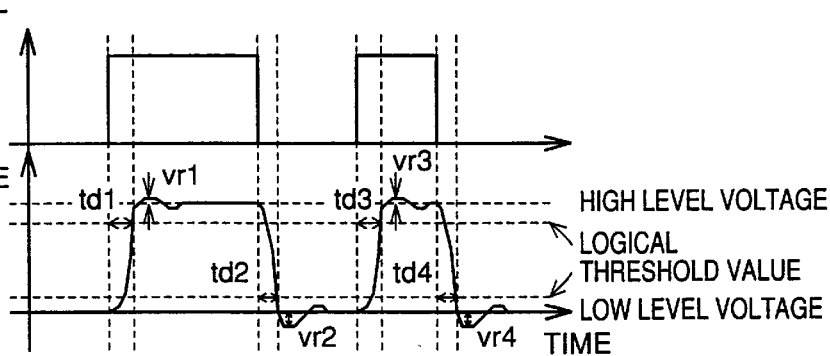
FIG.23A LOGICAL VALUE TIMING SIMULATION RESULT
FIG.23B VOLTAGE COMBINED SIMULATION RESULT
FIG.24A VOLTAGE COMBINED SIMULATION RESULT 1
FIG.24B COMBINED SIMULATION RESULT 2

SIMULATOR, SIMULATION METHOD, AND MEDIUM HAVING SIMULATION PROGRAM RECORDED, TAKING ACCOUNT OF TIMING IN ELECTRONIC COMPONENT AND SIGNAL TRANSMISSION THROUGH TRANSMISSION LINE ON PRINTED-CIRCUIT BOARD

Simulator, Simulation Method, and Medium Having Simulation Program Recorded, Taking Account of Timing in Electronic Component and Signal Transmission through Transmission Line on Printed-circuit Board

BACKGROUND OF THE INVENTION

1. Field of the Invention

The present invention relates to a simulator for verifying signal waveforms between electronic components mounted on a printed-circuit board. The invention more particularly relates to a simulator taking account of timing in an electronic component and signal transmission through transmission lines on a printed-circuit board.

2. Description of the Background Art

As the processing speed of an electronic component increases, timing simulation within the electronic component as well as transmission line simulation for wiring on a printed-circuit board become necessary in order to preliminarily detect any deficiency in circuits within the electronic component and that in a wiring pattern of the printed-circuit board.

FIG. 1 is a block diagram schematically illustrating a structure of a conventional timing simulator. The timing simulator includes a hardware description language holding section 101 provided with a logic circuit having its operation described with the hardware description language, a test pattern holding section 102 where a test pattern to be input to the logic circuit is stored, a timing simulation section 103 simulating the timing of the logic circuit by inputting the test pattern to the logic circuit having its operation described with the hardware description language, a timing simulation result holding section 104 holding result of the simulation executed by timing simulation section 103, and a timing simulation result display section 105 displaying the result of the timing simulation.

FIG. 2 is a block diagram schematically illustrating a structure of a conventional transmission line simulator. The transmission line simulator includes a circuit connecting information holding section 111 holding information on connection between electronic components mounted on a printed-circuit board, a wiring portion simulation model holding section 112 holding a simulation model of a wiring portion (transmission line) of the printed-circuit board, an I/O model holding section 113 holding a driver section and a receiver section of a modeled electronic component, a transmission line simulation section 114 simulating the transmission line using the circuit connecting information, the wiring portion simulation model, and the I/O model, a transmission line simulation result holding section 115 holding the result of the simulation by transmission line simulation section 114, a transmission delay information holding section 116 holding delay information of the transmission line determined by transmission line simulation section 114, and a transmission line simulation result display section 117 displaying the result of the transmission line simulation.

Transmission line simulation section 114 simulates the transmission line and stores the result of the transmission line simulation in transmission line simulation result holding section 115, and stores delay information with respect to the transmission line in transmission delay information holding section 116 in a form of SDF (Standard Delay Format) which can be used by the timing simulator.

When the entire printed-circuit board is simulated using the timing simulator and the transmission line simulator described above, timing simulation section 103 in the timing simulator uses the delay information stored in the SDF form in transmission delay information holding section 116 in the transmission line simulator to simulate circuits in an electronic component.

When the method is used of simulating the entire printed-circuit board using the timing simulator and the transmission line simulator described above, the result of the simulation presented to the user has the form which is supplied by the timing simulator. Therefore, the user can see the result only by logical values of a low level and a high level. Specifically, verification for signal integrity design taking account of reflection and ringing that are important factors for design of the printed-circuit board is difficult.

SUMMARY OF THE INVENTION

One object of the present invention is to provide a simulator that can execute transmission line simulation taking account of a result of timing simulation or a result of circuit simulation.

Another object of the present invention is to provide a simulation method by which transmission line simulation taking account of a result of timing simulation or a result of circuit simulation is possible.

Still another object of the present invention is to provide a medium in which a simulation program is recorded that enables transmission line simulation taking account of a result of timing simulation or a result of circuit simulation to be done.

According to one aspect of the present invention, a simulator includes a timing simulation section executing timing simulation for a logic circuit of an electronic component, a time management section extracting logical operation time at an output terminal of the electronic component from a result of the timing simulation, a transmission line simulation section executing a simulation of a transmission line connected to the output terminal from the logical operation time extracted by the time management section, and a simulation result processing section combining the result of the simulation by the timing simulation section and a result of the simulation of the transmission line by the transmission line simulation section.

The simulation of the transmission line taking account of the result of the simulation executed for the logic circuit of the electronic component is possible, since the simulation result processing section combines the result of the simulation by the timing simulation section and the result of the simulation of the transmission line by the transmission line simulation section.

According to another aspect of the invention, a simulation method includes a step of executing simulation for a logic circuit of an electronic component to extract logical operation time at an output terminal of the electronic component from a result of the simulation, a step of executing simulation of a transmission line connected to the output terminal from the extracted logical operation time, and a step of combining the result of the simulation and a result of the simulation of the transmission line.

The simulation of the transmission line taking account of the result of the simulation executed for the logic circuit of the electronic component is possible since the result of the simulation and the result of the transmission line simulation are combined.

According to still another aspect of the present invention, a simulation program recorded in a medium includes a step of executing simulation for a logic circuit of an electronic component to extract logical operation time at an output terminal of the electronic component from a result of the simulation, a step of executing simulation of a transmission line connected to the output terminal from the extracted logical operation time, and a step of combining the result of the simulation and a result of the simulation of the transmission line.

The simulation of the transmission line taking account of the result of the simulation executed for the logic circuit of the electronic component is possible since the result of the simulation and the result of the transmission line simulation are combined.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8A shows a relation between a rising waveform and a logical threshold value, and FIG. 8B shows a relation between a falling waveform and a logical threshold value.

FIGS. 9A–9C are provided for describing a combined simulation result.

FIGS. 23A and 23B are presented for describing comparison between a result of timing simulation and a combined simulation result.

FIG. 24A and 24B are presented for describing comparison between combined simulation results.

DESCRIPTION OF THE PREFERRED EMBODIMENTS

Figure 1:
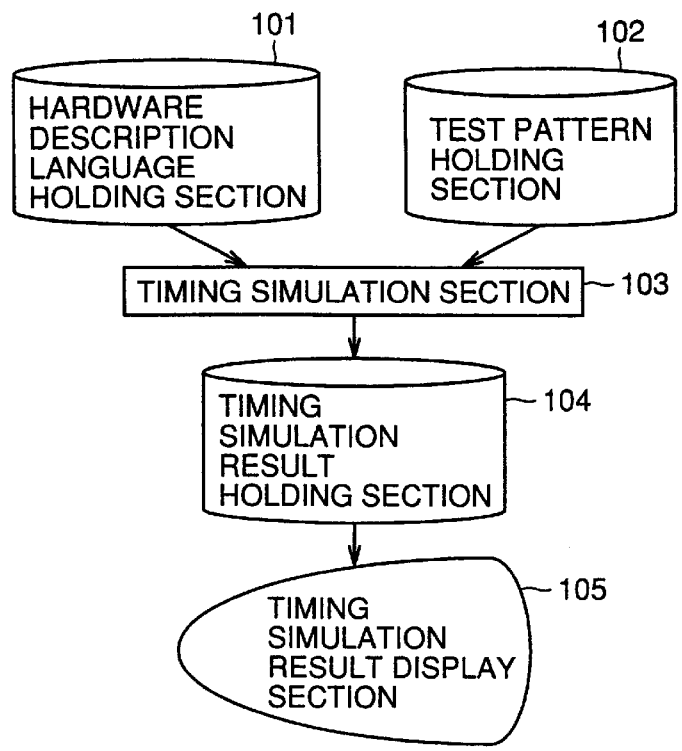
FIG. 1 is a schematic block diagram showing a structure of a conventional timing simulator.
Figure 2:
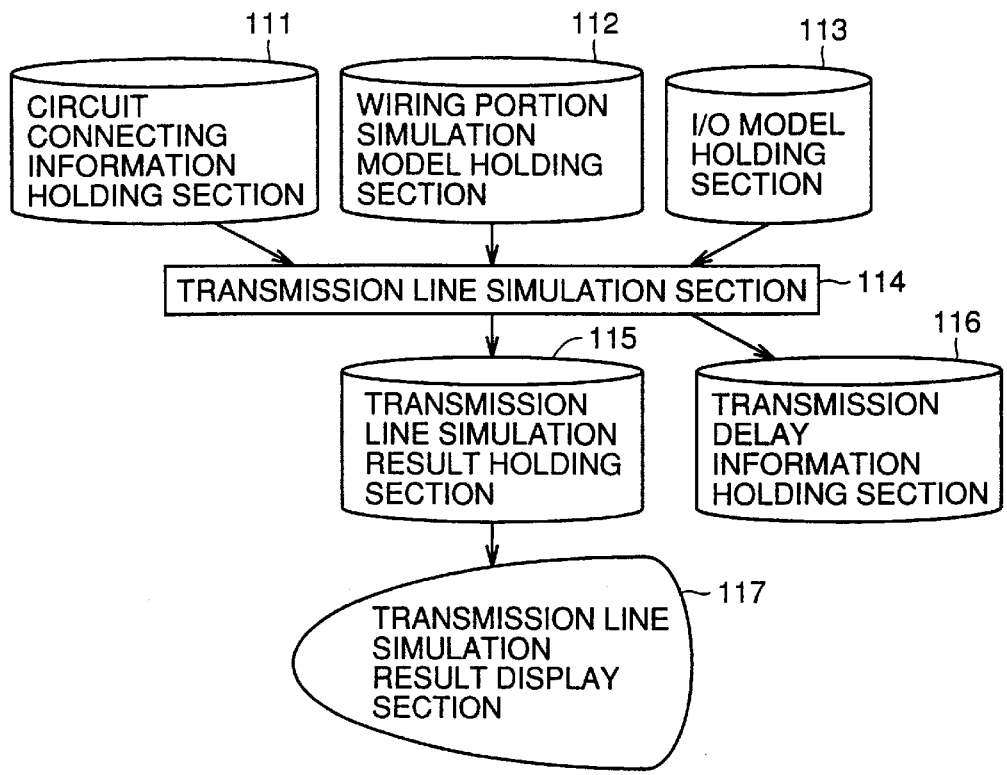
FIG. 2 is a schematic block diagram illustrating a structure of a conventional transmission line simulator.
Figure 3:
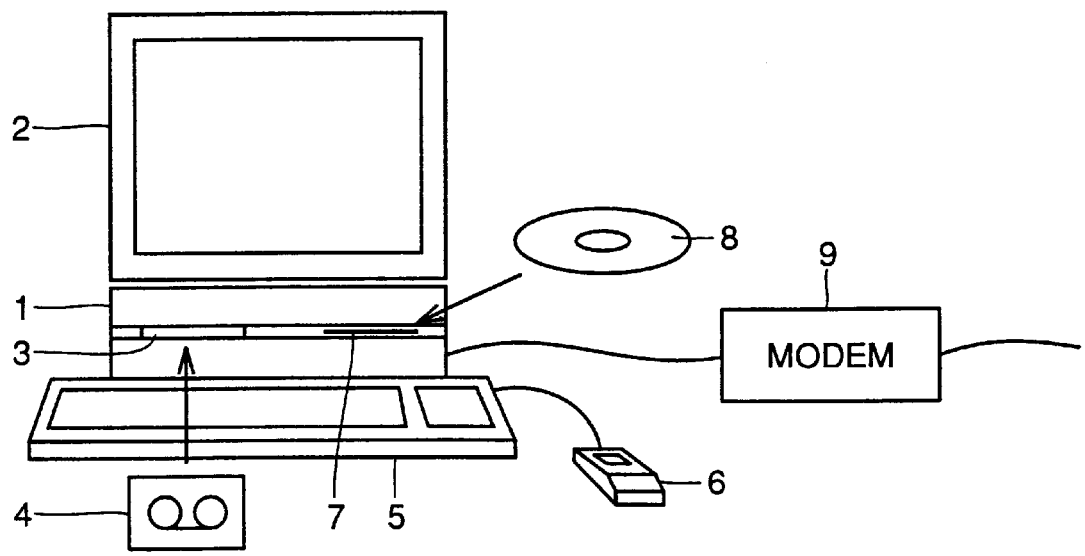
FIG. 3 shows an external view of a simulator of the present invention.

FIG. 3 shows one example of an external view of a simulator according to the present invention. The simulator includes a body of computer 1, a graphic display unit 2, a magnetic tape unit 3 to which a magnetic tape is provided, a keyboard 5, a mouse 6, a CD-ROM unit 7 to which a CD-ROM (Compact Disk-Read Only Memory) 8 is provided, and a communication modem 9. A simulation program is supplied by a storage medium such as a magnetic tape 4 or a CD-ROM 8. Computer body 1 executes the simulation program and an operator manipulates keyboard 5 or mouse 6 while watching graphic display unit 2 to execute a simulation. The simulation program may be supplied to the computer body 1 from another computer through a communication channel via communication modem 9.

Figure 4:
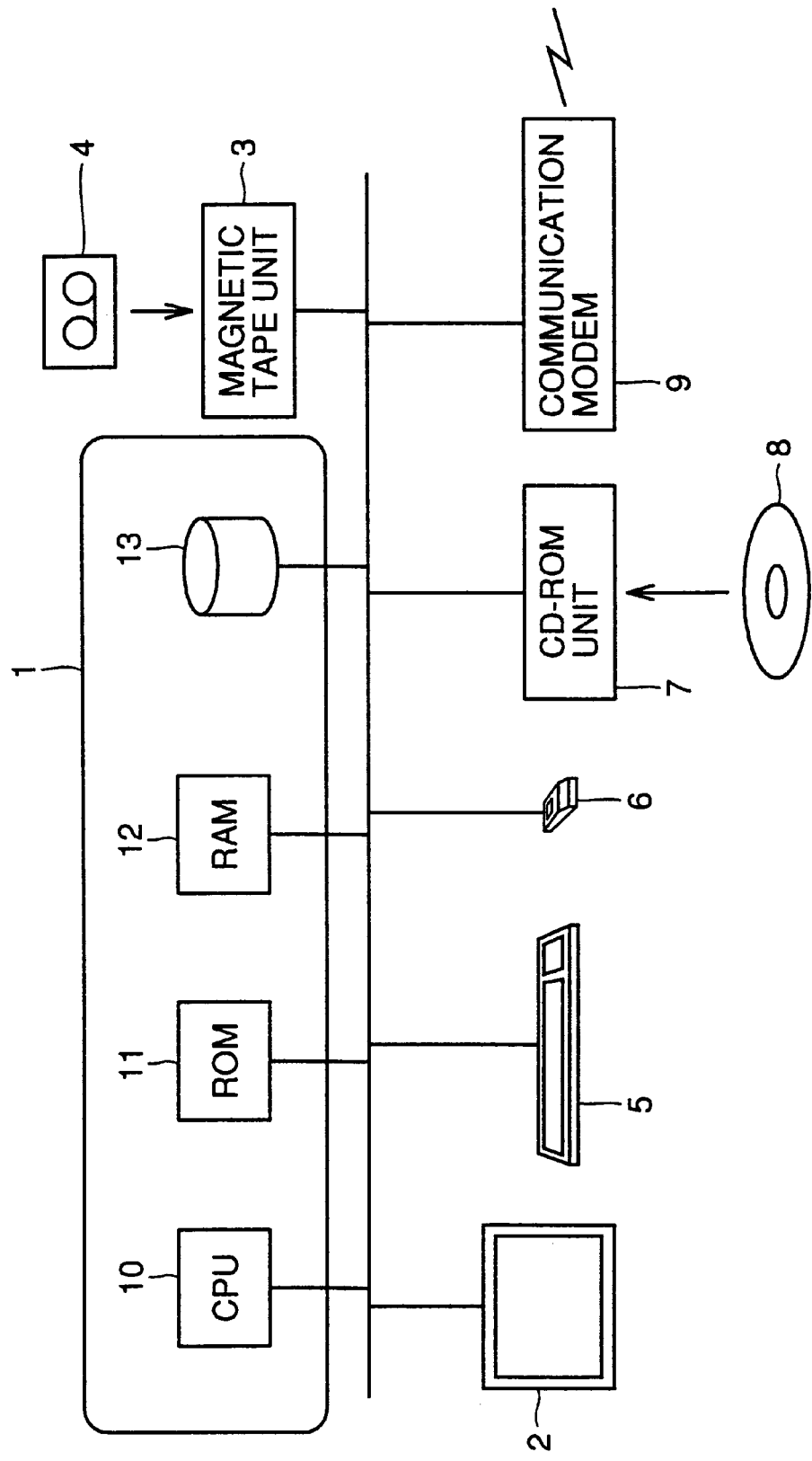
FIG. 4 illustrates a structure of the simulator of the present invention.

FIG. 4 is a block diagram illustrating one example of a structure of the simulator of the present invention. Computer body 1 shown in FIG. 3 includes a CPU (Central Processing Unit) 10, an ROM (Read Only Memory) 11, an RAM (Random Access Memory) 12 and a hard disk 13. CPU 10 executes processing while supplying/receiving data to/from graphic display unit 2, magnetic tape unit 3, keyboard 5, mouse 6, CD-ROM unit 7, communication modem 9, ROM 11, RAM 12 or hard disk 13. The simulation program recorded on magnetic tape 4 or CD-ROM 8 is temporarily stored in hard disk 13 by CPU 10 via magnetic tape unit 3 or CD-ROM unit 7. CPU 10 properly loads the simulation program from hard disk 13 into RAM 12 and executes it to do a simulation.

Simulators according to respective embodiments of the present invention are described below. The external view of the simulator illustrated in FIG. 3 and the structural block diagram of the simulator illustrated in FIG. 4 are commonly applied to respective embodiments.

(First Embodiment)

Figure 5:
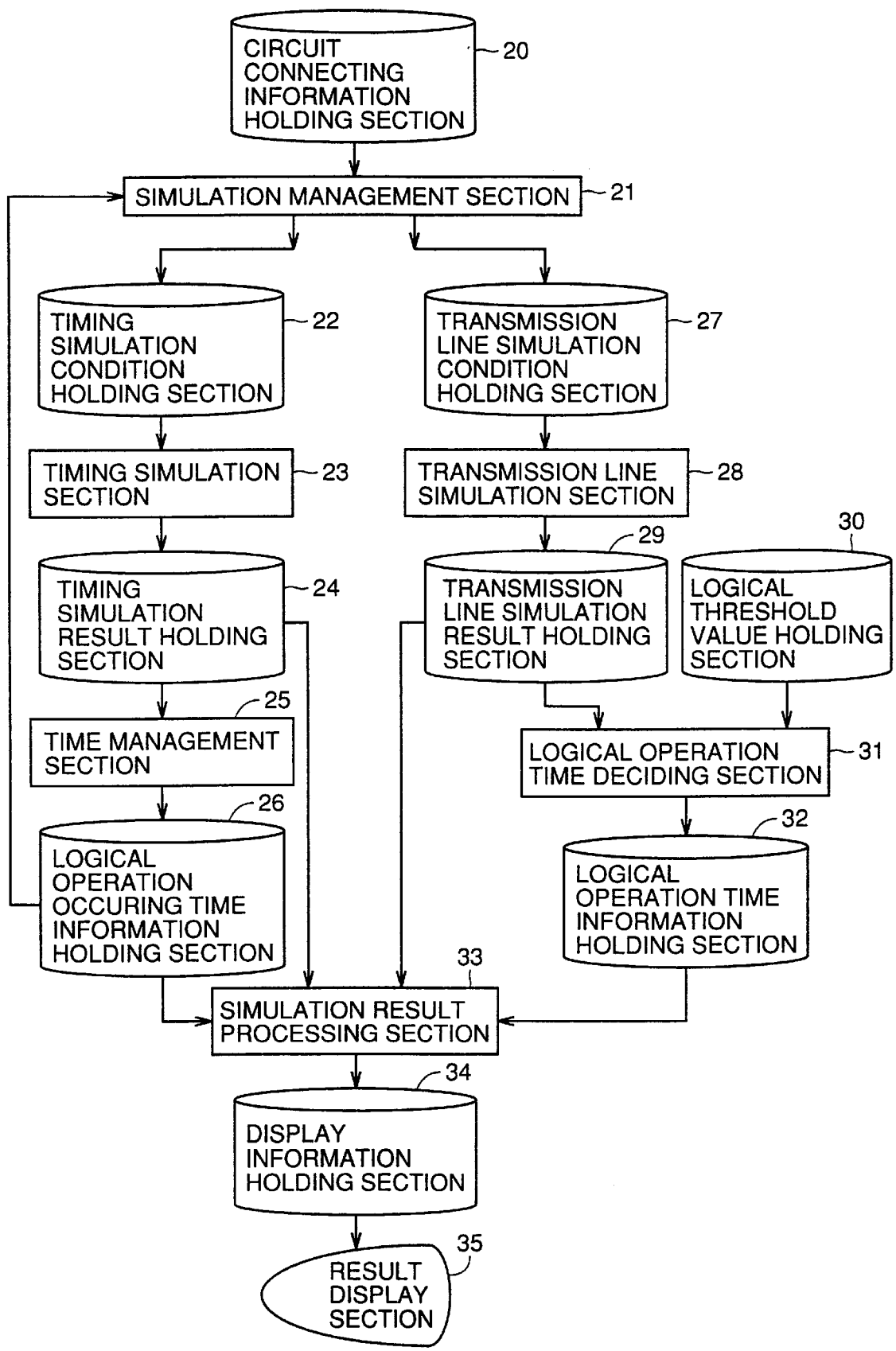
FIG. 5 is provided for describing a schematic structure of a simulator according to the first embodiment of the present invention.

FIG. 5 is a block diagram illustrating a schematic structure of a simulator according to the first embodiment of the invention. The simulator includes: a circuit connecting information holding section 20 holding information on a logic circuit in each electronic component and information on connection between electronic components mounted on a printed-circuit board; a simulation management section 21 setting a condition of timing simulation and setting a condition of transmission line simulation; a timing simulation condition holding section 22 holding the condition of the timing simulation set by simulation management section 21; a timing simulation section 23 executing the timing simulation using the information on the logic circuit of the electronic component held by circuit connecting information holding section 20, the condition of the timing simulation held by timing simulation condition holding section 22, and a test pattern; a timing simulation result holding section 24 holding a result of the simulation by timing simulation section 23; a time management section 25 extracting, from the result of the timing simulation, logical operation occurring time (for example, when the timing simulation of the logic circuit is executed with 0V–5V, time at which voltage begins to rise from 0V is referred to as logical operation occurring time at which logic changes from "0" to "1," and time at which voltage begins to fall from 5V is referred to as logical operation occurring time at which logic changes from "1" to "0") for each transmission line on the printed-circuit board; a logical operation occurring time holding section 26 holding the logical operation occurring time extracted by time management section 25; a transmission line simulation condition holding section 27 holding the condition of the transmission line simulation set by simulation management section 21; a transmission line simulation section 28 executing the transmission line simulation using the circuit connecting information held by circuit connecting information holding section 20, a wiring portion simulation model, and an I/O model; a transmission line simulation result holding section 29 holding a result of the simulation by transmission line simulation section 28; a logical threshold value holding section 30 holding a threshold value when the logic changes; a logical operation time deciding section 31 extracting logical operation time from the result of the transmission line simulation and the logical threshold value; a logical operation time information holding section 32 holding the logical operation time extracted by logical operation time deciding section 31; a simulation result processing section 33 combining the result of the timing simulation, the information on the logical operation occurring time, the result of the transmission line simulation and the information on the logical operation time to produce a combined simulation result; a display information holding section 34 holding information on the combined simulation result by simulation result processing section 33; and a result display section 35 displaying information held by display information holding section 34.

Figure 6:
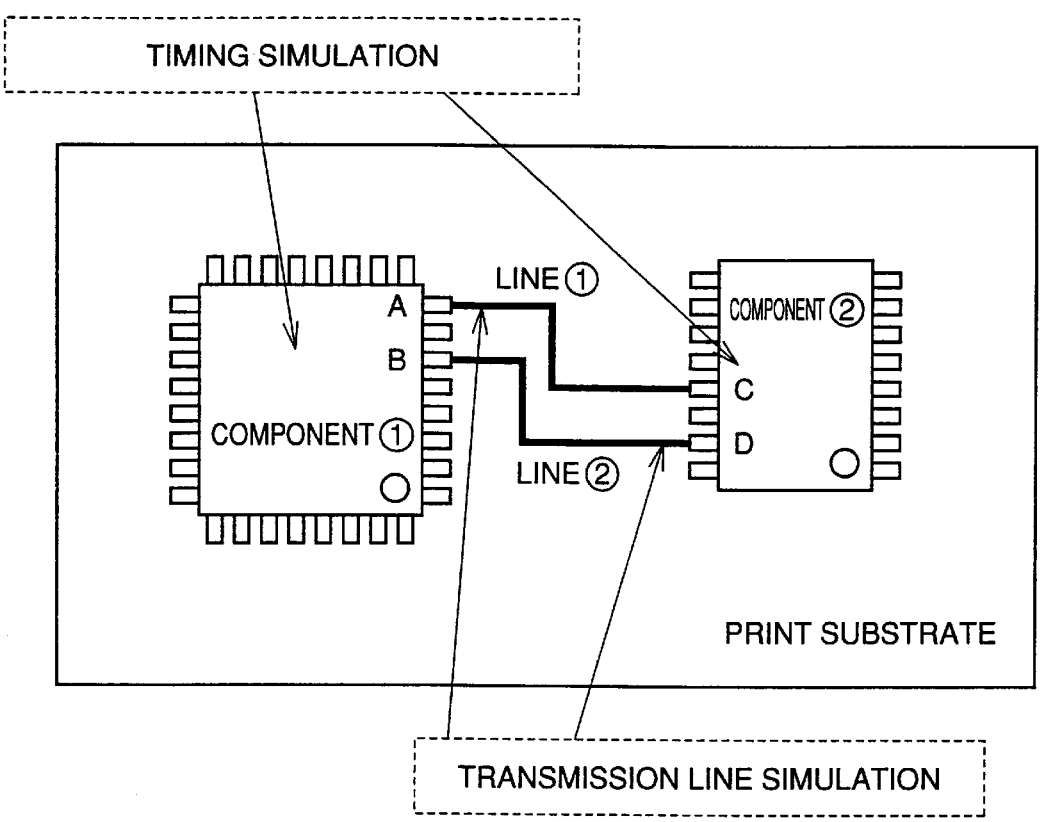
FIG. 6 shows one example of a printed-circuit board on which electronic components are mounted.

FIG. 6 illustrates one example of a printed-circuit board on which electronic components simulated by the simulator according to this embodiment is mounted. Electronic components ①  and ② are mounted on the printed-circuit board, an output terminal A of electronic component ① is connected to an input terminal C of electronic component ② by a transmission line ①, and an output terminal B of electronic component ① is connected to an input terminal D of electronic component ② by a transmission line ②. Timing simulation section 23 executes simulation of logic circuits in electronic components ① and ②. Transmission line simulation section 28 executes simulation of transmission lines ① and ②. When timing simulation of output buffers for output terminals A and B of electronic component ① is done, wiring capacitance of transmission lines ① and ② is not considered and only the output capacitance of the output buffers is considered.

Figure 7:
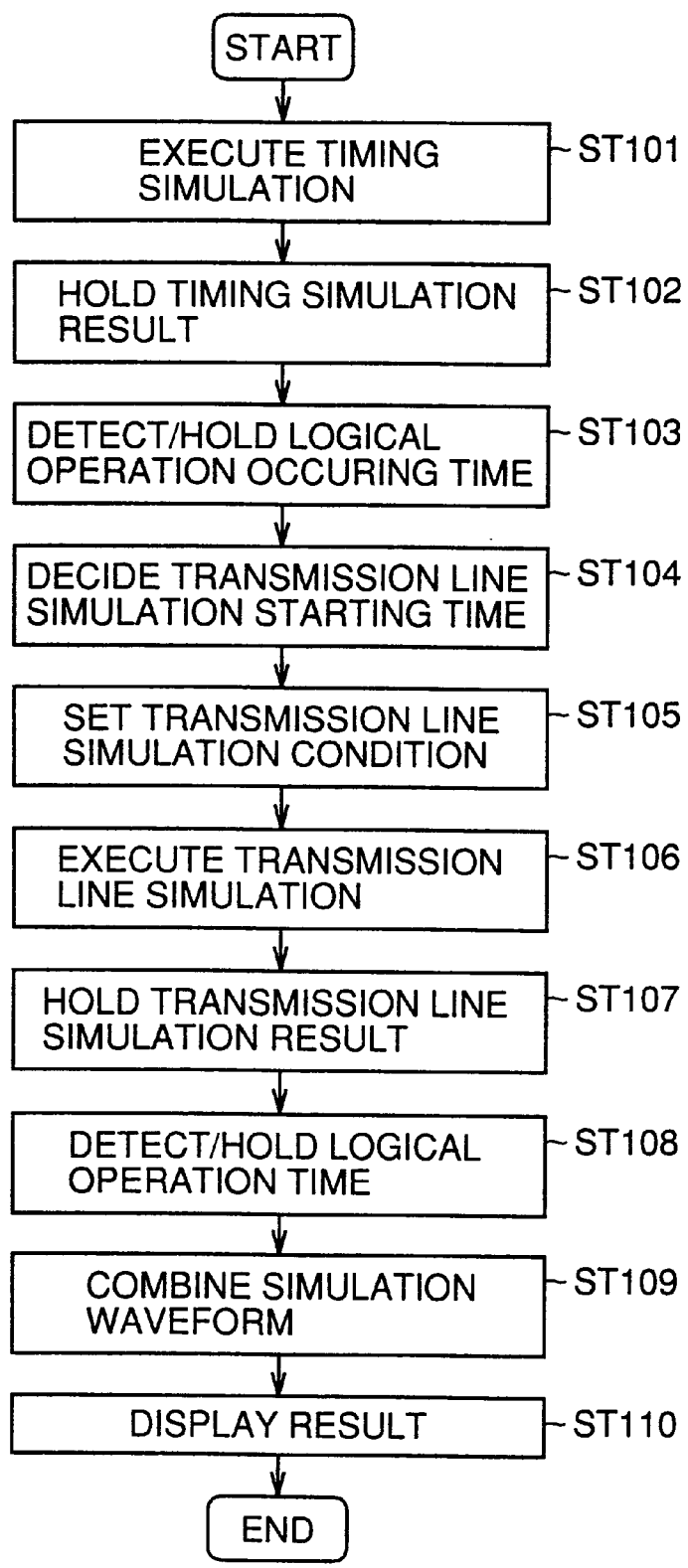
FIG. 7 is a flow chart provided for describing a processing procedure of the simulator according to the first embodiment of the present invention.

FIG. 7 is a flow chart presented for describing a processing procedure of the simulator according to this embodiment. Timing simulation section 23 executes timing simulation using the information on the logic circuit of the electronic component held by circuit connecting information holding section 20, the condition of the timing simulation set by simulation management section 21, and a test pattern (ST101). Logical operation time of an electronic component at a preceding stage extracted by logical operation time deciding section 31 is used as a condition of timing simulation as describe below.

Timing simulation section 23 stores a result of the timing simulation in timing simulation result holding section 24 (ST102). Time management section 25 extracts logical operation occurring time from the result of the timing simulation stored in timing simulation result holding section 24 and stores it in logical operation occurring time information holding section 26 (ST103). The time at which voltage begins to rise from 0V is referred to as the logical operation occurring time at which logic changes from "0" to "1" and the time at which voltage begins to fall from 5V is referred to as the logical operation occurring time at which the logic changes from "1" to "0" when the timing simulation of the logic circuit is executed with 0V–5V as described above.

Simulation management section 21 reads the logical operation occurring time stored in logical operation occurring time information holding section 26 and decides on a transmission line simulation starting time as the logical operation occurring time (ST104), and stores it in transmission line simulation condition holding section 27 (ST105).

Transmission line simulation section 28 performs simulation of the transmission line using the circuit connecting information stored in circuit connecting information holding section 20, a wiring portion simulation model, and an I/O model (ST106), and stores the result of the transmission line simulation in transmission line simulation result holding section 29 (ST107). The wiring portion simulation model used to do simulation by transmission line simulation section 28 is produced by modeling information on the structure of the printed-circuit board (structures of the ground layer, wiring layer, insulation layer and the like), the thickness of a substrate, dielectric constant of a dielectric layer, shape of lines, width of lines, thickness of lines, conductivity of lines and the like. The I/O model is obtained by modeling electrical features (output voltage, output current and the like) of a driver section, and electrical features (input capacitance and the like) of a receiver section.

Logical operation time deciding section 31 extracts logical operation time from the result of the transmission line simulation stored in transmission line simulation result holding section 29. For example, if a rising waveform shown in FIG. 8A is obtained as a result of the transmission line simulation, time at which voltage attains a logical threshold value T1 of a high level is determined as logical operation time. If a falling waveform illustrated in FIG. 8B is obtained as a result of the transmission line simulation, time at which voltage has a logical threshold value T2 of a low level is determined as the logical operation time. Logical operation time deciding section 31 stores the obtained logical operation time in logical operation time information holding section 32 (ST108).

Simulation result processing section 33 combines the result of the timing simulation stored in timing simulation result holding section 24, the logical operation occurring time information stored in logical operation occurring time information holding section 26, the result of the transmission line simulation stored in transmission line simulation result holding section 29, and the logical operation time held by logical operation time information holding section 32 to generate a combined simulation result (ST109), and the combined simulation result is displayed on result display section 35 (ST110).

Suppose that the result of the timing simulation illustrated in FIG. 9A is stored in timing simulation result holding section 29, and the result of the transmission line simulation illustrated in FIG. 9B is stored in transmission line simulation result holding section 29. Simulation result processing section 33 replaces the rising waveforms of the timing simulation result with the rising waveforms of the result of the transmission line simulation from logical operation occurring time T1 and from T3, and replaces the falling waveforms of the timing simulation result with the falling waveforms of the transmission line simulation result from logical operation occurring time T2 and from T4. Consequently, the combined simulation result shown in FIG. 9C is produced.

The simulator according to this embodiment thus executes the transmission line simulation for lines connected to output terminals of the electronic component based on the result of the timing simulation of the logic circuit of the electronic component as described above. Accordingly, the simulation of the transmission line taking account of the result of the timing simulation becomes possible. Further, delay time (skew) between transmission lines on the printed-circuit board can be simulated easily.

(Second Embodiment)

Figure 10:
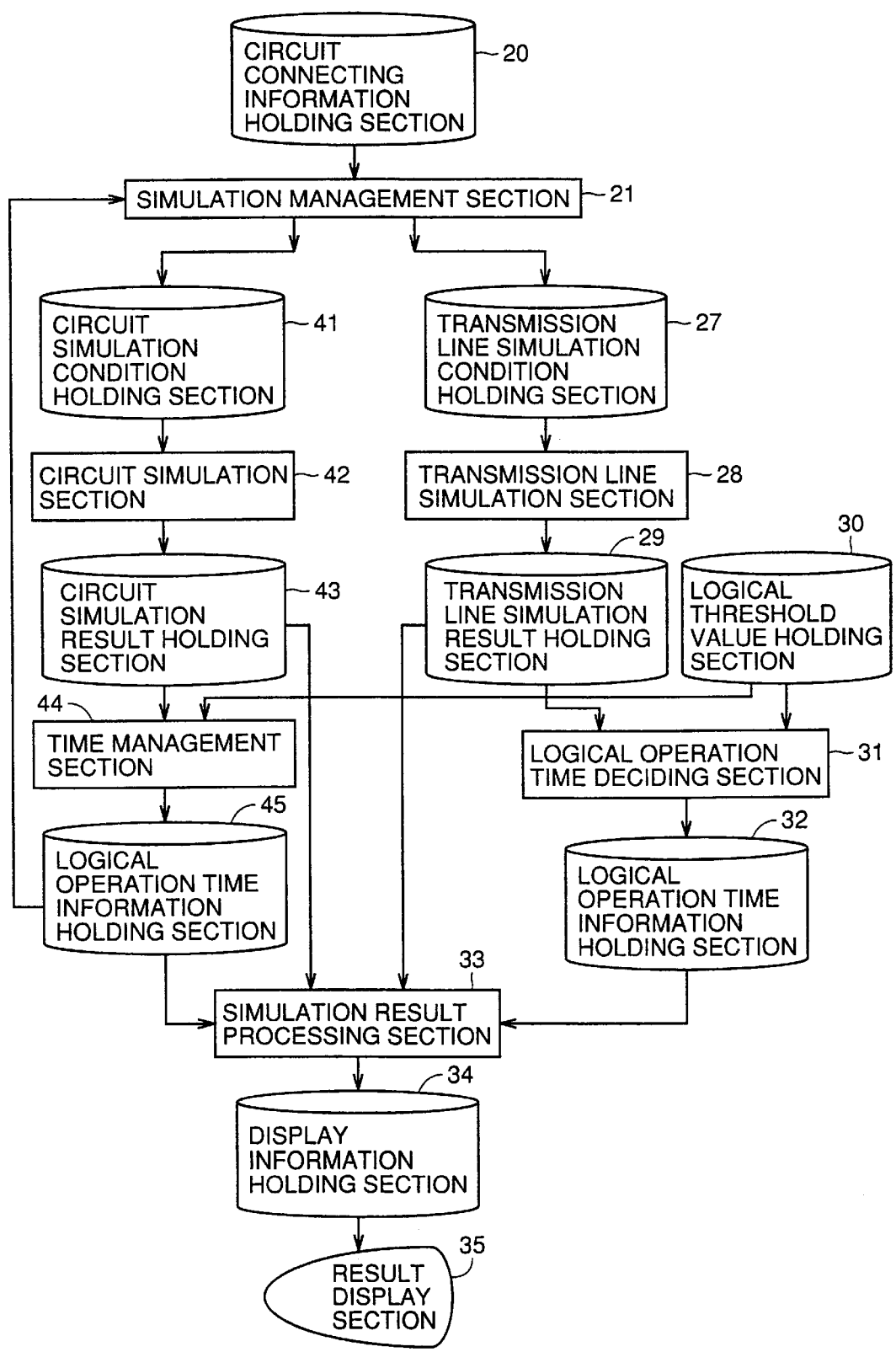
FIG. 10 shows a schematic structure of a simulator according to the second embodiment of the present invention.

FIG. 10 is a block diagram illustrating a schematic structure of a simulator according to the second embodiment of the invention. The only difference between the simulator of the first embodiment shown in FIG. 5 and the simulator of the second embodiment is that timing simulation condition holding section 22, timing simulation section 23, timing simulation result holding section 24, time management section 25 and logical operation occurring time information holding section 26 are respectively replaced by a circuit simulation condition holding section 41, a circuit simulation section 42, a circuit simulation result holding section 43, a time management section 44, and a logical operation time information holding section 45. A detailed description of the common structures and functions of those simulators is not repeated.

Figure 11:
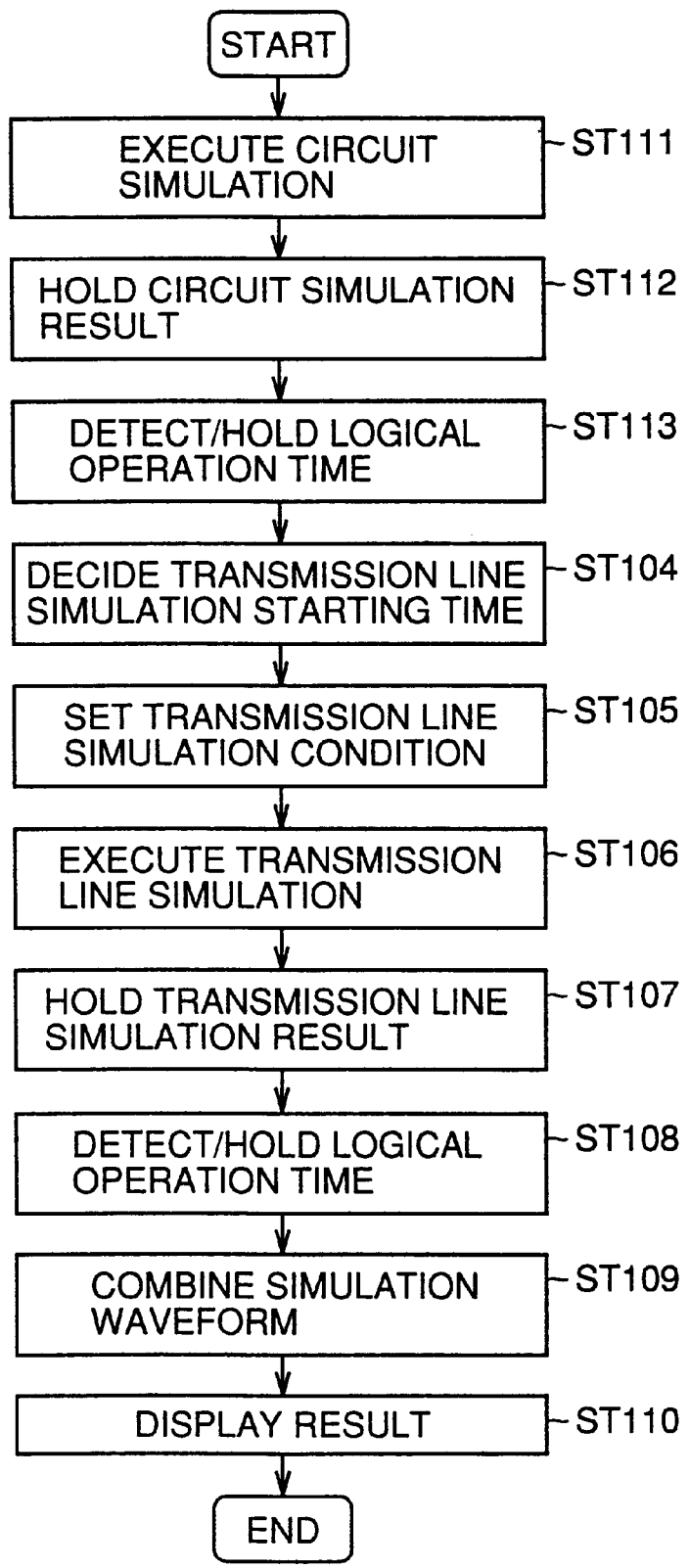
FIG. 11 is a flow chart provided for describing a processing procedure of the simulator according to the second embodiment of the present invention.

FIG. 11 is a flow chart presented for describing a processing procedure of the simulator according to the second embodiment. The flow chart for the simulator of the second embodiment is different from that for the simulator of the first embodiment shown in FIG. 7 only in that steps ST101–ST103 are replaced by steps ST111–ST113. A detailed description of the common steps of the processing procedure is not repeated here.

Circuit simulation section 42 executes circuit simulation using information on the logic circuit of the electronic component held by circuit connecting information holding section 20, the condition of the circuit simulation set by simulation management section 21, and an input waveform (ST111). As the condition of the circuit simulation, logical operation time of an electronic component at a preceding stage extracted by logical operation time deciding section 31 is used.

Circuit simulation section 42 stores a result of the circuit simulation in circuit simulation result holding section 43 (ST112). Time management section 44 extracts logical operation time from the result of the circuit simulation stored in circuit simulation result holding section 43, and the logical threshold value stored in logical threshold value holding section 30, and stores the logical operation time in logical operation time information holding section 45 (ST113). The logical operation time is obtained by extracting the time at which the result of the circuit simulation corresponds to the logical threshold value. Transmission line simulation section 28 executes the transmission line simulation using the logical operation time (time corresponding to the threshold value) stored in logical operation time information holding section 45.

The simulator of the second embodiment allows the logical operation time to be extracted more precisely compared with the case in which the transmission line simulation is executed using the result of the timing simulation, since the transmission line simulation for a line to which an output terminal of an electronic component is connected is executed based on the result of the circuit simulation for the logic circuit of the electronic component.

(Third Embodiment)

Figure 12:
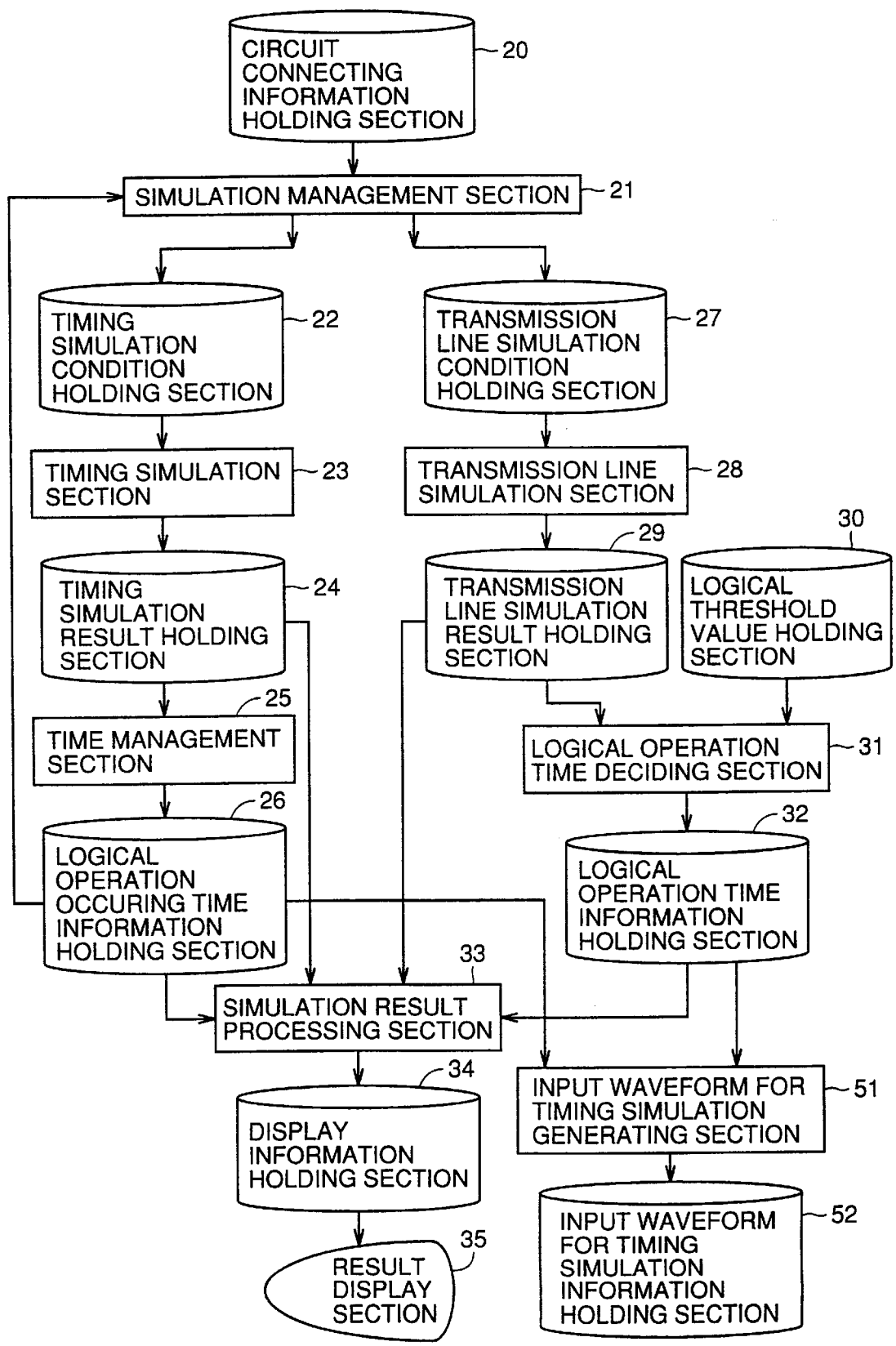
FIG. 12 illustrates a schematic structure of a simulator according to the third embodiment of the present invention.

FIG. 12 is a block diagram illustrating a schematic structure of a simulator according to the third embodiment of the invention. The simulator of this embodiment is different from the simulator of the first embodiment shown in FIG. 5 only in that an input waveform for timing simulation generating section 51 generating an input waveform for timing simulation from the logical operation occurring time stored in logical operation occurring time information holding section 26 and the information on the logical operation time stored in logical operation time information holding section 32, and an input waveform for timing simulation information holding section 52 storing the input waveform for the timing simulation are added. Therefore, a detailed description of the common structures and functions is not repeated here.

Figure 13:
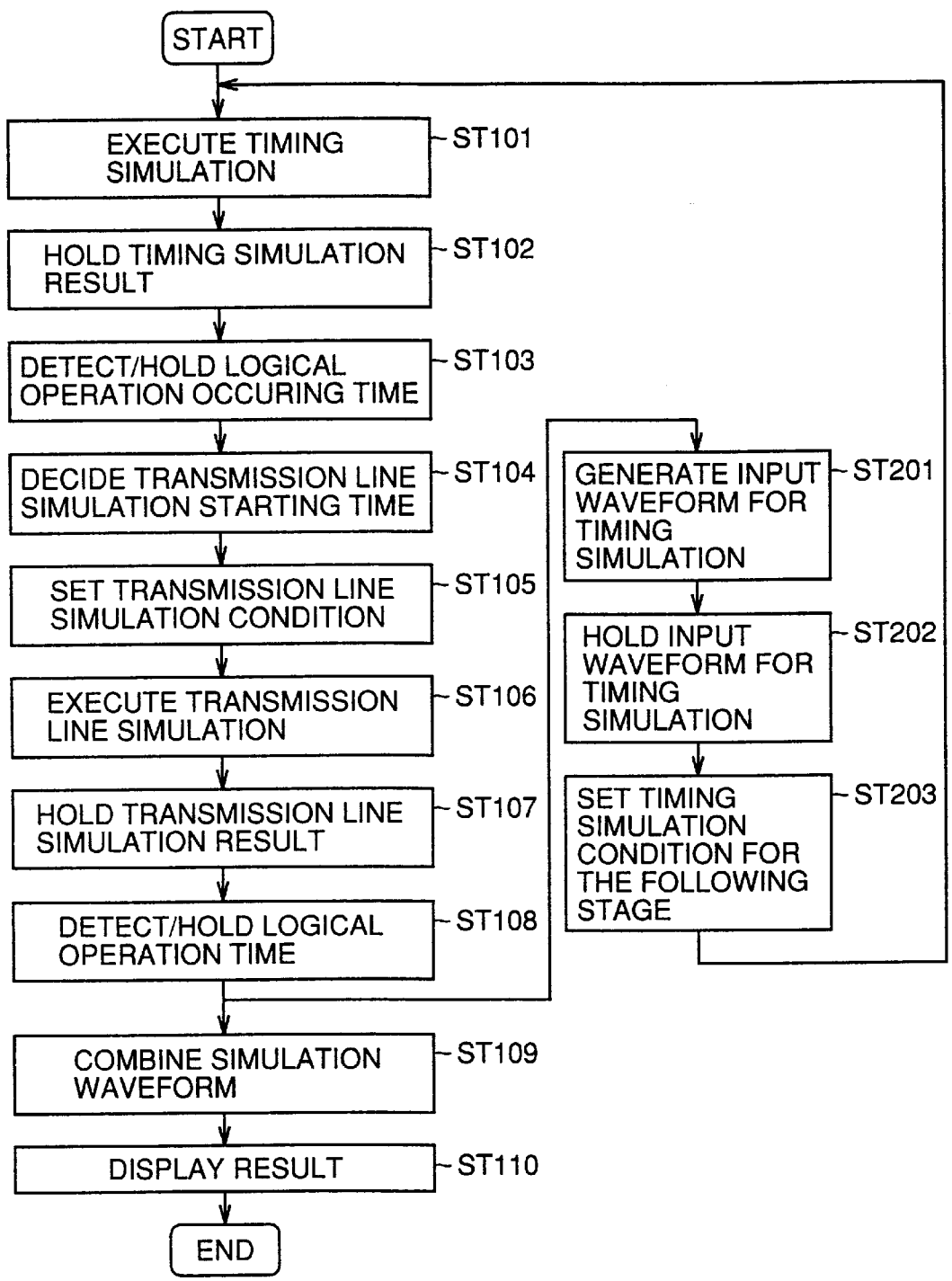
FIG. 13 is a flow chart presented for describing a processing procedure of the simulator according to the third embodiment of the present invention.

FIG. 13 is a flow chart presented for describing a processing procedure of the simulator according to the third embodiment. The difference between the flow chart for the simulator of the first embodiment shown in FIG. 7 and that for the simulator of the third embodiment is that steps ST201–ST203 are added. Therefore, the common steps of the processing procedure are not described in detail here.

Figure 14:
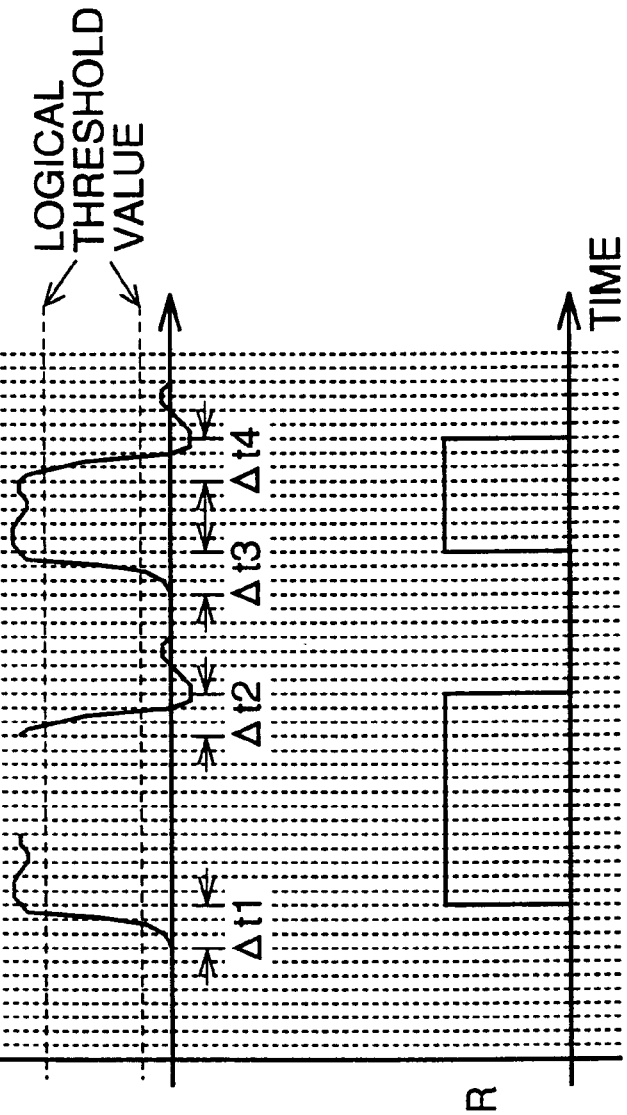
FIGS. 14A–14C are provided for describing generation of an input waveform for timing simulation.

Input waveform for timing simulation generating section 51 reads in step ST103 the logical operation occurring time stored in logical operation occurring time information holding section 26, and reads in step ST108 the logical operation time stored in logical operation time holding section 32, to generate an input waveform for timing simulation (ST201). For example, if a result of the timing simulation shown in FIG. 14A is obtained by timing simulation section 23, logical operation occurring time t1, t2, t3 and t4 are obtained by time management section 25. Further, if a result of the transmission line simulation shown in FIG. 14B is obtained by transmission line simulation section 28, logical operation time $\Delta t1$, $\Delta t2$, $\Delta t3$ and $\Delta t4$ are obtained by logical operation time deciding section 31. Input waveform for timing simulation generating section 51 generates an input waveform for the timing simulation shown in FIG. 14C (where the logic changes at t1+$\Delta t1$, t2+$\Delta t2$, t3+$\Delta t3$ and t4+$\Delta t4$) from the logical operation occurring time and the logical operation time.

Input waveform for timing simulation generating section 51 stores the generated waveform for timing simulation in input waveform for timing simulation information holding section 52 (ST202). Simulation management section 21 stores the input waveform for the timing simulation in timing simulation condition holding section 22 as an input waveform to an electronic component at a following stage (e.g. component ② shown in FIG. 6) (ST203), and executes simulation of the electronic component at the following stage or the like by repeating the steps after step 101.

Simulation of the entire printed-circuit board on which a plurality of electronic components are mounted becomes possible since the input waveform for the timing simulation can be generated from the logical operation occurring time extracted from the result of the timing simulation and the logical operation time extracted from the result of the transmission line simulation.

(Fourth Embodiment)

Figure 15:
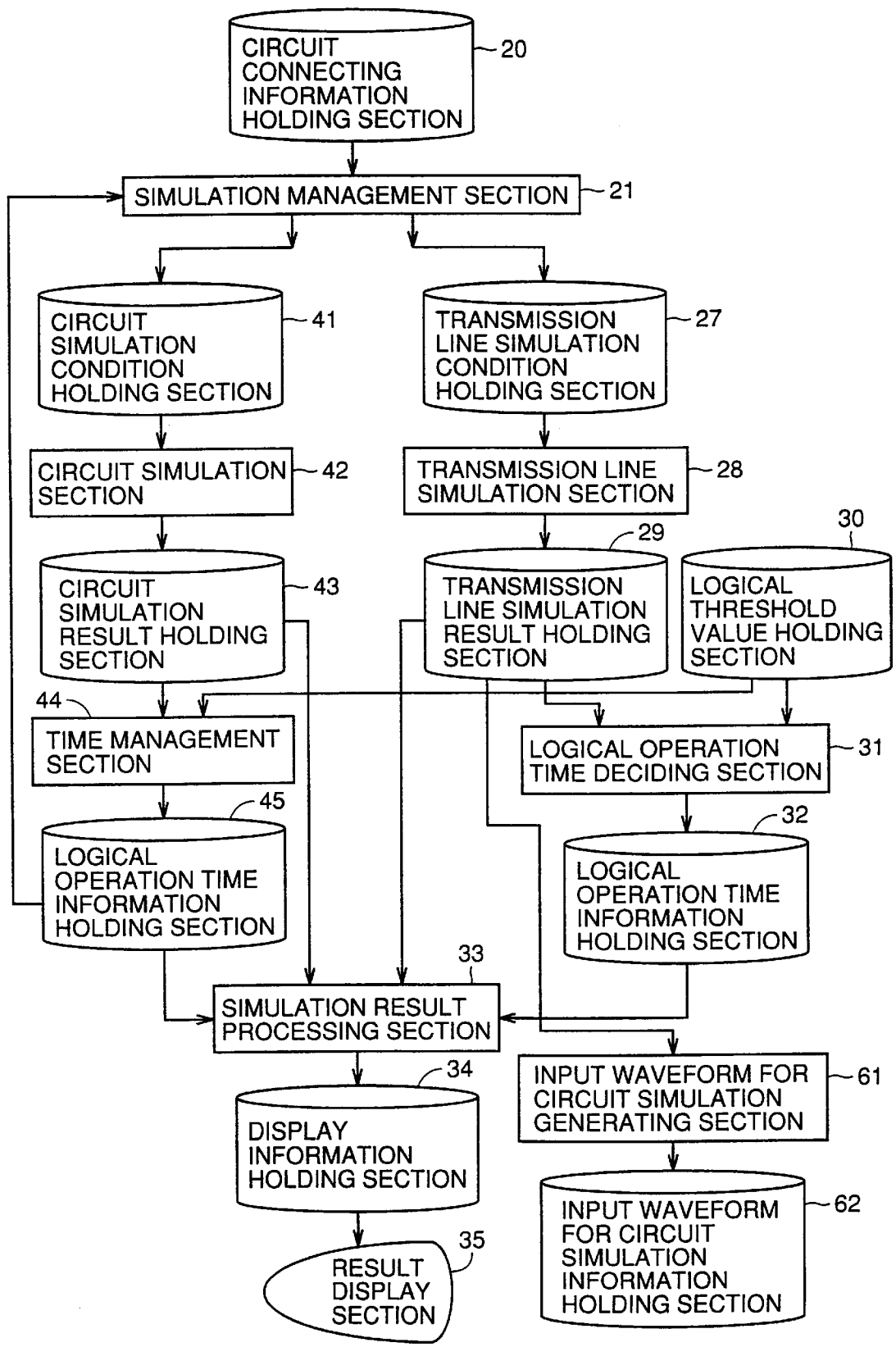
FIG. 15 illustrates a schematic structure of a simulator according to the fourth embodiment of the present invention.

FIG. 15 is a block diagram showing a schematic structure of a simulator according to the fourth embodiment of the invention. The simulator of the fourth embodiment is different from the simulator of the second embodiment illustrated in FIG. 10 only in that an input waveform for circuit simulation generating section 61 generating an input waveform for circuit simulation from the result of the transmission line simulation stored in transmission line simulation result holding section 29, and an input waveform for circuit simulation information holding section 62 in which the input waveform for circuit simulation is held are added. Therefore, a detailed description of the common structures and functions is not repeated here.

Figure 16:
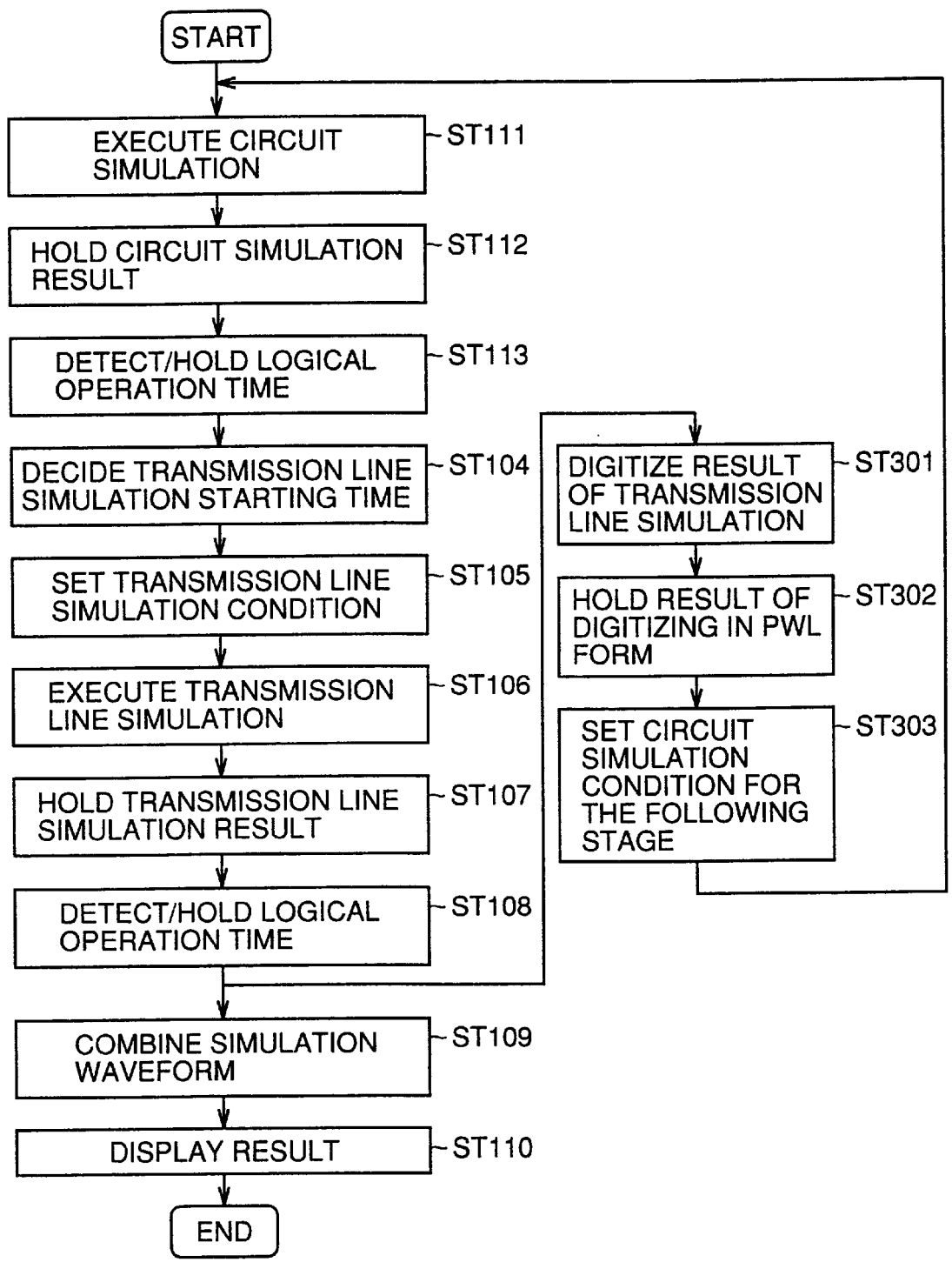
FIG. 16 is a flow chart presented for describing a processing procedure of the simulator according to the fourth embodiment of the present invention.

FIG. 16 is a flow chart presented for describing a processing procedure of the simulator of the fourth embodiment. A difference between the flow chart for the simulator of the fourth embodiment and that for the simulator of the second embodiment shown in FIG. 11 is that steps ST301–ST303 are added. A detailed description of the common steps of the processing procedure is not repeated.

Input waveform for circuit simulation generating section 61 generates an input waveform for circuit simulation by reading and digitizing the result of the transmission line simulation stored in transmission line simulation result holding section 29 in step ST107 (ST301). The input waveform for the circuit simulation is generated in a form of PWL (PieceWise linear) which is one of power supply description formats. The PWL form data is obtained through sampling by dividing changes of voltage and time of the result of transmission line simulation into small sections at the same intervals.

Input waveform for circuit simulation generating section 61 stores the input waveform for the circuit simulation generated in the PWL form in input waveform for circuit simulation information holding section 62 (ST302). Simulation management section 21 stores the input waveform for circuit simulation in circuit simulation condition holding section 41 as an input waveform to an electronic component at the following stage (e.g. component ② shown in FIG. 6) (ST303), and executes simulation of the electronic component at the following stage or the like by repeating the steps after step 111.

The simulator of the fourth embodiment enables the entire printed-circuit board on which a plurality of electronic components are mounted to be simulated since the input waveform for circuit simulation generated from the result of the circuit simulation can be generated in the PWL form.

(Fifth Embodiment)

A simulator according to the fifth embodiment is obtained by changing only the function of input waveform for circuit simulation generating section 61 of the simulator of the fourth embodiment shown in FIG. 15. Therefore, a detailed description of the common structures and functions is not repeated. An input waveform for circuit simulation generating section will be described as 61'.

Figure 17:
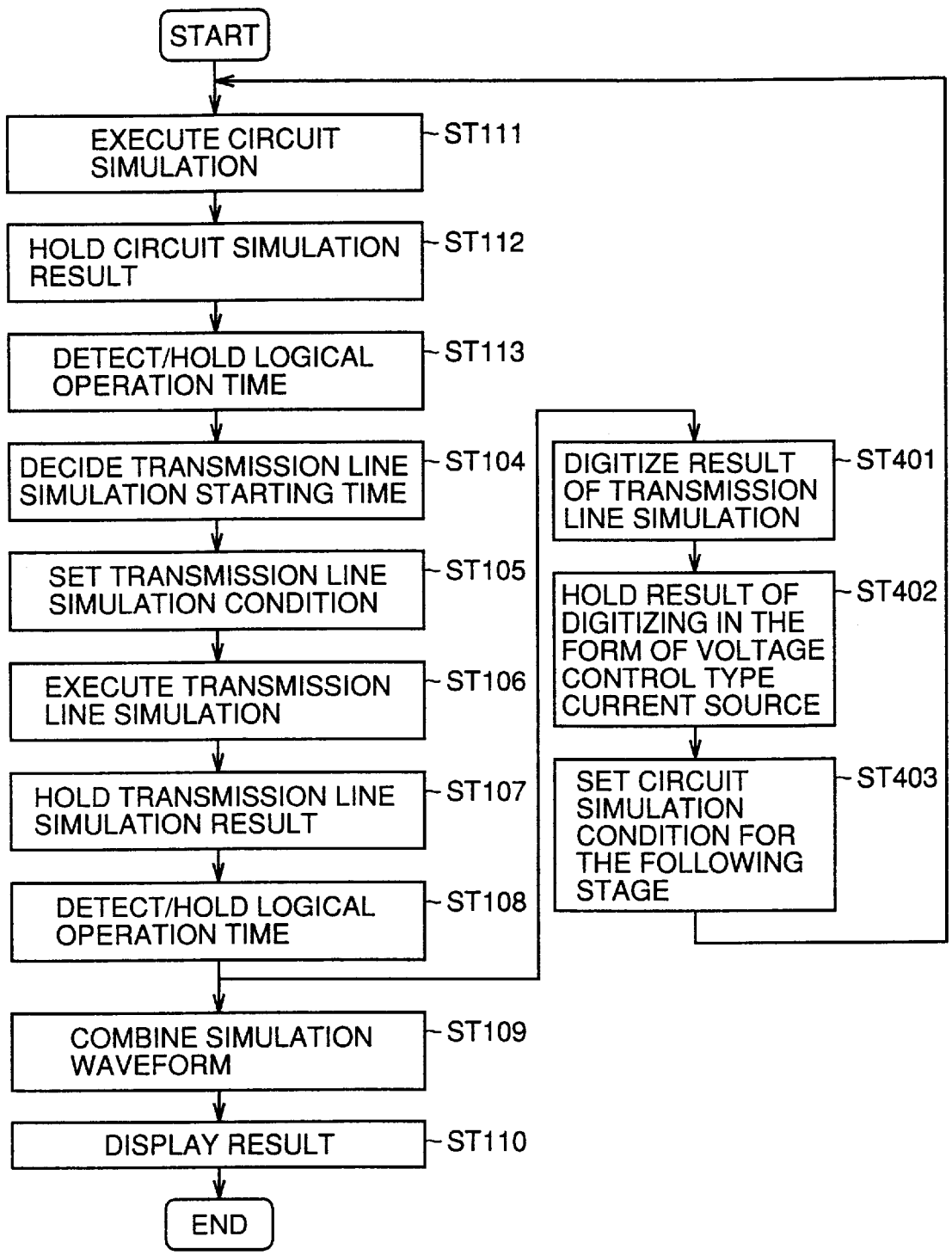
FIG. 17 is a flow chart presented for describing a processing procedure of a simulator according to the fifth embodiment of the present invention.

FIG. 17 is a flow chart presented for describing a processing procedure of the simulator of the fifth embodiment. The flow chart of FIG. 17 is different from the flow chart for the simulator of the fourth embodiment shown in FIG. 16 only in that steps ST301–ST303 are replaced by steps ST401–ST403. Therefore, a detailed description of the common steps of the processing procedure is not repeated.

Input waveform for circuit simulation generating section 61' generates an input waveform for circuit simulation by reading and digitizing the result of the transmission line simulation stored in transmission line simulation result holding section 29 in step ST107 (ST401). The input waveform for circuit simulation is generated in a form of voltage control type current source which is one of power supply description formats. The form of the voltage control type current source data is obtained through sampling by dividing changes of voltage, current and time of the result of the transmission line simulation into small sections at the same intervals.

Input waveform for circuit simulation generating section 61' stores the generated input waveform for circuit simulation in the form of the voltage control type current source in input waveform for circuit simulation information holding section 62 (ST402). Simulation management section 21 stores the input waveform for circuit simulation in circuit simulation condition holding section 41 as an input waveform to an electronic component at a following stage (e.g. component ② in FIG. 6) (ST403), and executes simulation of the electronic component at the following stage or the like by repeating steps after step 111.

The simulator of the fifth embodiment can improve precision of simulation further compared with the simulator of the fourth embodiment since the input waveform for circuit simulation generated from the result of the circuit simulation can be generated in the form of the voltage control type current source.

(Sixth Embodiment)

A simulator according to this embodiment is obtained by only changing the functions of simulation management section 21 and transmission line simulation result holding section 29 of the simulator of the first embodiment illustrated in FIG. 5. A detailed description of the common structures and functions is not repeated here. Simulation management section 21 and transmission line simulation result holding section 29 are referred to as 21' and 29' respectively to be described.

A result of simulation which has already been executed for a transmission line between paired pins is held in transmission line simulation result holding section 29'. Simulation management section 21' determines whether the simulation of the transmission line between the paired pins has already been executed or not when it instructs transmission line simulation section 28 to execute the transmission line simulation. If the simulation of the transmission line between the paired pins has already been executed, simulation management section 21' instructs transmission line simulation section 28 not to execute the simulation of the transmission line between the paired pins. In this case, simulation result processing section 33 generates a combined simulation result using the result of the transmission line simulation which has been held in transmission line simulation result holding section 29'.

If the simulation of the transmission line between the paired pins has not been executed, simulation management section 21' instructs transmission line simulation section 28 to execute simulation of the transmission line between the paired pins.

The simulator according to the sixth embodiment can dramatically reduce the time for simulation since the transmission line simulation is not executed for the transmission line between the paired pins when simulation of the transmission line therebetween has been executed.

(Seventh Embodiment)

A simulator according to the seventh embodiment is obtained by only changing the functions of simulation management section 21 and transmission line simulation result holding section 29 of the simulator of the first embodiment shown in FIG. 5. Therefore, a detailed description of the common structures and functions is not repeated. Simulation management section 21 and transmission line simulation result holding section 29 are referred respectively to as 21" and 29" to be described.

Before instructing timing simulation section 23 to execute timing simulation, simulation management section 21" instructs transmission line simulation section 28 to execute simulation of all the transmission lines between the paired pins. Transmission line simulation section 28 stores a result of the transmission line simulation in transmission line simulation result holding section 29".

Simulation management section 21" instructs timing simulation section 24 to execute timing simulation. After time management section 25 extracts logical operation occurring time from the result of the timing simulation, simulation result processing section 33 uses the result of the transmission line simulation which has already been held in transmission line simulation result holding section 29" for generating a combined simulation result and in this case, simulation management section 21" does not instruct transmission line simulation section 28 to execute transmission line simulation.

The simulator of the seventh embodiment thus can reduce the simulation time further compared with the simulator of the sixth embodiment since the transmission line simulation is executed for all of the transmission lines in advance and the result of the transmission line simulation is held.

(Eighth Embodiment)

A simulator of this embodiment is obtained by changing the function of logical operation time deciding section 31 of the simulator of the first embodiment shown in FIG. 5. Therefore, a detailed description of the common structures and functions is not repeated. Logical operation time deciding section 31 is now referred to as 31' to be described.

Logical operation time deciding section 31' additionally has a function of reading an arbitrary threshold value from logical threshold value holding section 30 in accordance with instruction from the user. Logical operation time deciding section 31' extracts logical operation time by comparing a threshold value read from logical threshold value holding section 30 with the result of the transmission line simulation stored in transmission line simulation result holding section 29.

The simulator of this embodiment makes it possible to execute simulation more precisely since the simulation can be performed even if the voltage level between the power supply/ground of the printed-circuit board changes to cause change in a threshold value.

(Ninth Embodiment)

Figure 18:
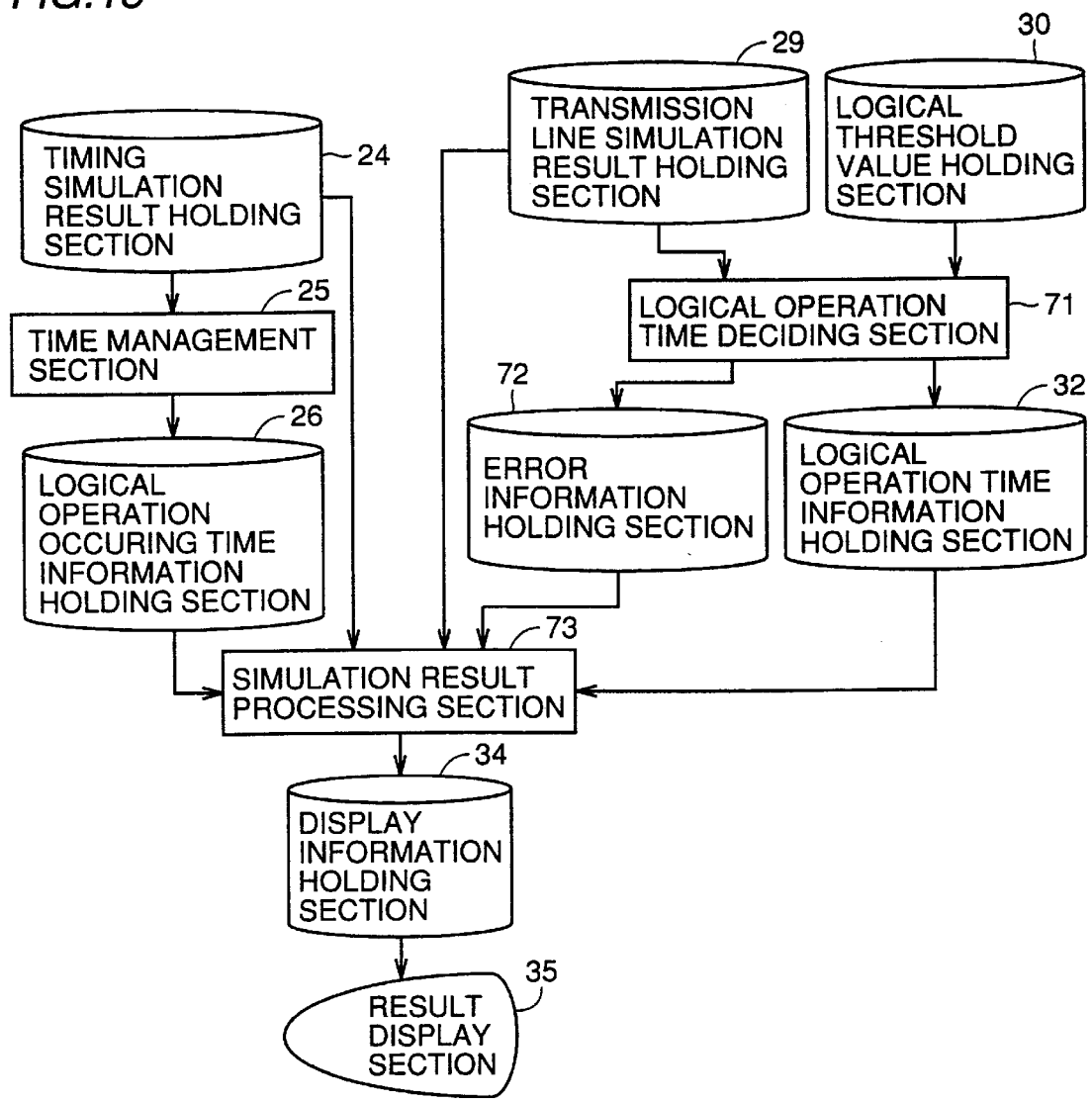
FIG. 18 illustrates a schematic structure of a simulator according to the ninth embodiment of the present invention.

FIG. 18 is a block diagram illustrating a schematic structure of a simulator of the ninth embodiment of the invention. A difference between the simulator of the ninth embodiment and that of the first embodiment illustrated in FIG. 5 is that the functions of logical operation time deciding section 31 and simulation result processing section 33 are changed and an error information holding section 72 is added. Therefore, a detailed description of the common structures and functions is not repeated. Logical operation time deciding section 31 and simulation result processing section 33 are respectively referred to as 71 and 73.

Figures 19A, 19B:
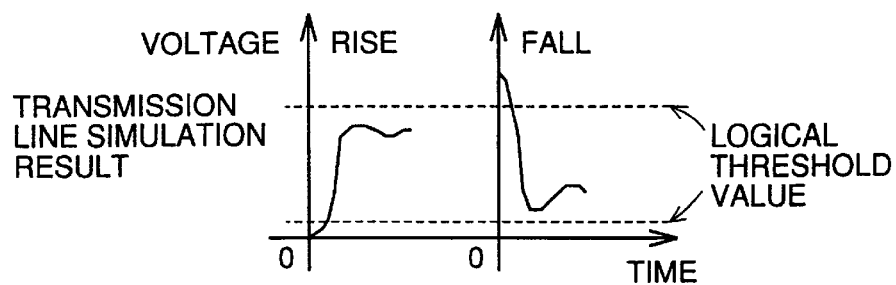
FIG. 19A shows that a rising waveform does not exceed a logical threshold value.
FIG. 19B shows that a falling waveform does not fall below a logical threshold value.

Logical operation time deciding section 71 additionally has a function to determine whether the result of the transmission line simulation by transmission line simulation section 28 goes beyond a logical threshold value and output error information to simulation result processing section 73 if the simulation result does not go beyond the threshold value. For example, if the voltage does not exceed a logical threshold value of a high level when a signal rises as shown in FIG. 19A, or the voltage does not fall below a logical threshold value of a low level when a signal falls as shown in FIG. 19B, logical operation time deciding section 71 stores error information in error information holding section 72. Simulation result processing section 73 converts the error information into data for display or the like and stores it in display information holding section 34. Result display section 35 informs the user of an error by displaying the error information.

The simulator of this embodiment can easily specify an improper portion on the printed-circuit board by displaying the error information on result display section 35.

(Tenth Embodiment)

The simulator of the tenth embodiment is different from the simulator of the ninth embodiment shown in FIG. 18 only in that the functions of logical operation time deciding section 71 and simulation result processing section 73 are changed. A detailed description of the common structures and functions is not repeated here. Logical operation time deciding section 71 and simulation result processing section 73 are respectively referred to as 71' and 73' to be described.

Figures 20A, 20B:
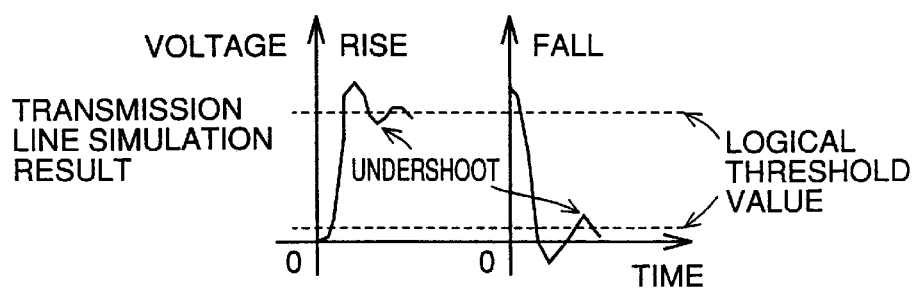
FIG. 20A shows that undershoot of a rising waveform falls below a logical threshold value at a high level.
FIG. 20B shows that undershoot of a falling waveform exceeds a logical threshold value at a low level.

Logical operation time deciding section 71' has a function to determine whether the result of the transmission line simulation by transmission line simulation section 28 goes beyond a logical threshold value due to undershoot, and output error information to simulation result processing section 73' if the simulation result goes beyond the logical threshold value. For example, if the undershoot upon rising of a signal falls below a logical threshold value of a high level as shown in FIG. 20A, or the undershoot upon falling of a signal exceeds a logical threshold value of a low level as shown in FIG. 20B, logical operation time deciding section 71' stores error information in error information holding section 72. Simulation result processing section 73' converts the error information into data for display or the like and stores the converted one in display information holding section 34. The user is informed of the error by result display section 35 displaying the error information.

The simulator of the tenth embodiment can easily specify an improper portion of the printed-circuit board as described above since the information on an error due to the undershoot is displayed on result display section 35.

(Eleventh Embodiment)

Figure 21:
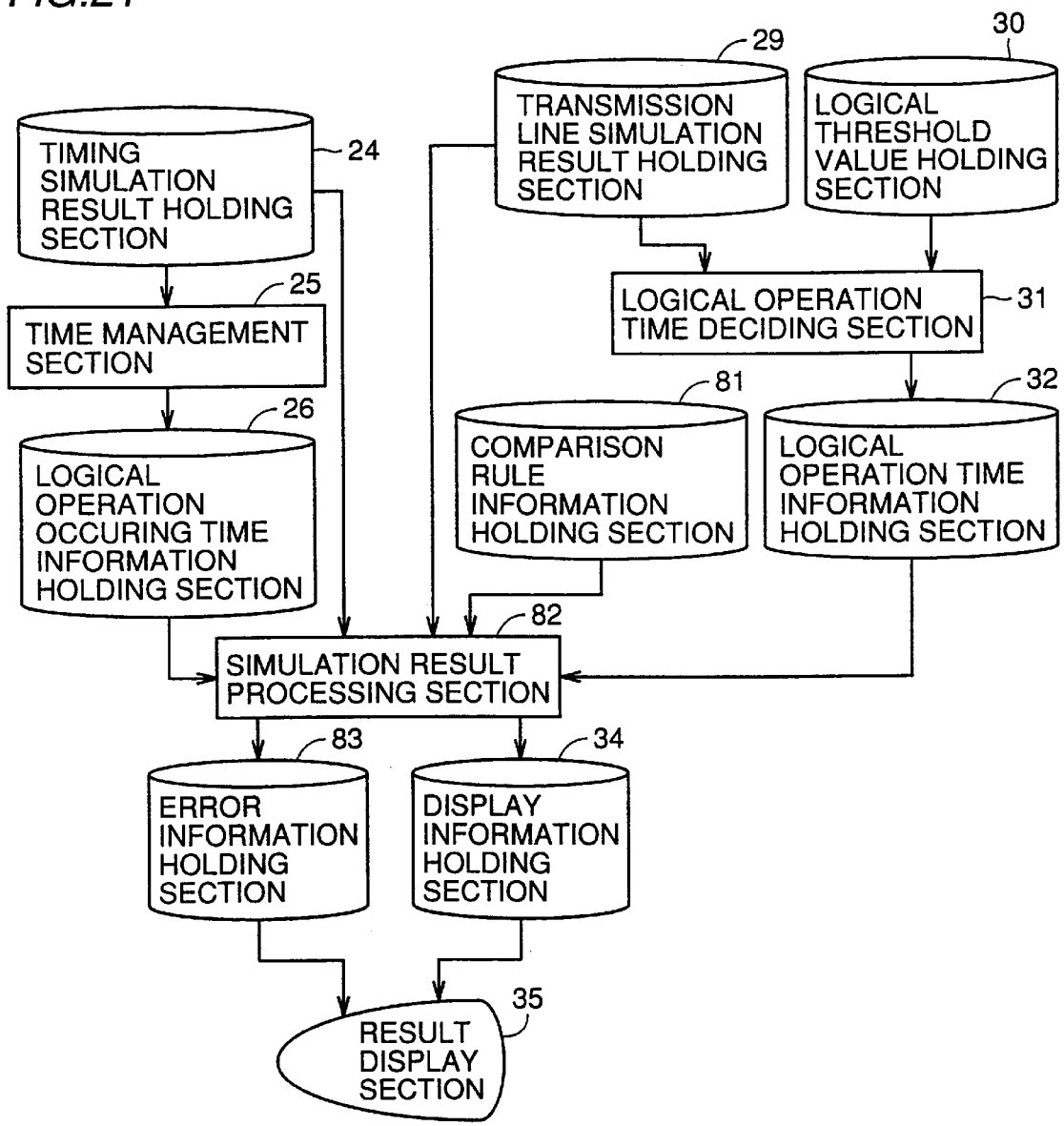
FIG. 21 illustrates a schematic structure of a simulator according to the eleventh embodiment of the present invention.

FIG. 21 is a block diagram illustrating a schematic structure of a simulator according to the eleventh embodiment of the invention. A difference between the simulator of this embodiment and the simulator of the first embodiment shown in FIG. 5 is that a comparison rule information holding section 81 and an error information holding section 83 are added and the function of simulation result processing section 33 is changed. A detailed description of the common structures and functions is not repeated here. Simulation result processing section 33 is referred to as 82 to be described.

Comparison rule information holding section 81 holds information on a comparison rule used for comparing the result of the timing simulation by timing simulation section 23 and the combined simulation result.

Figure 22:
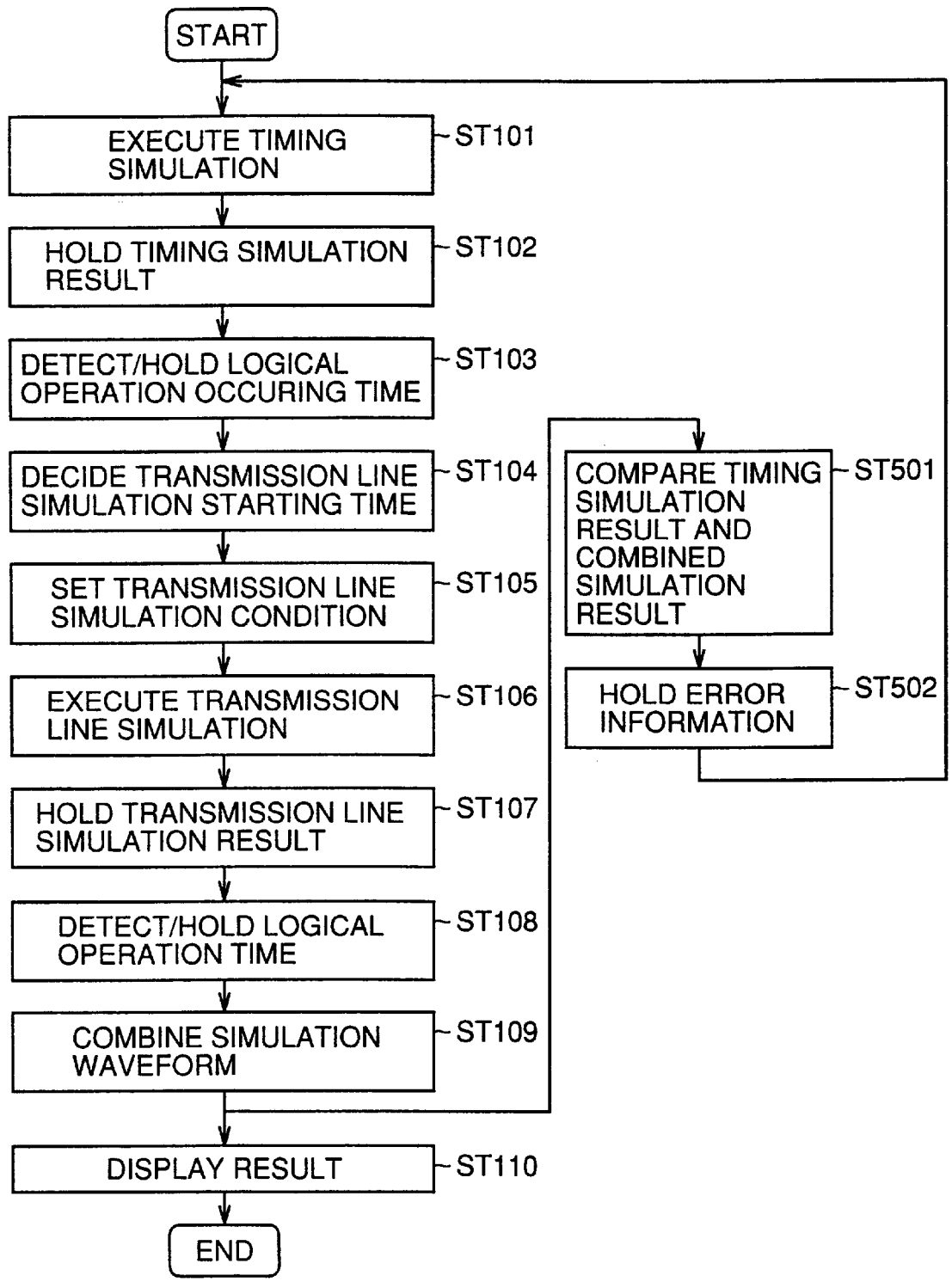
FIG. 22 is a flow chart presented for describing a processing procedure of the simulator according to the eleventh embodiment of the present invention.
Figure 25:
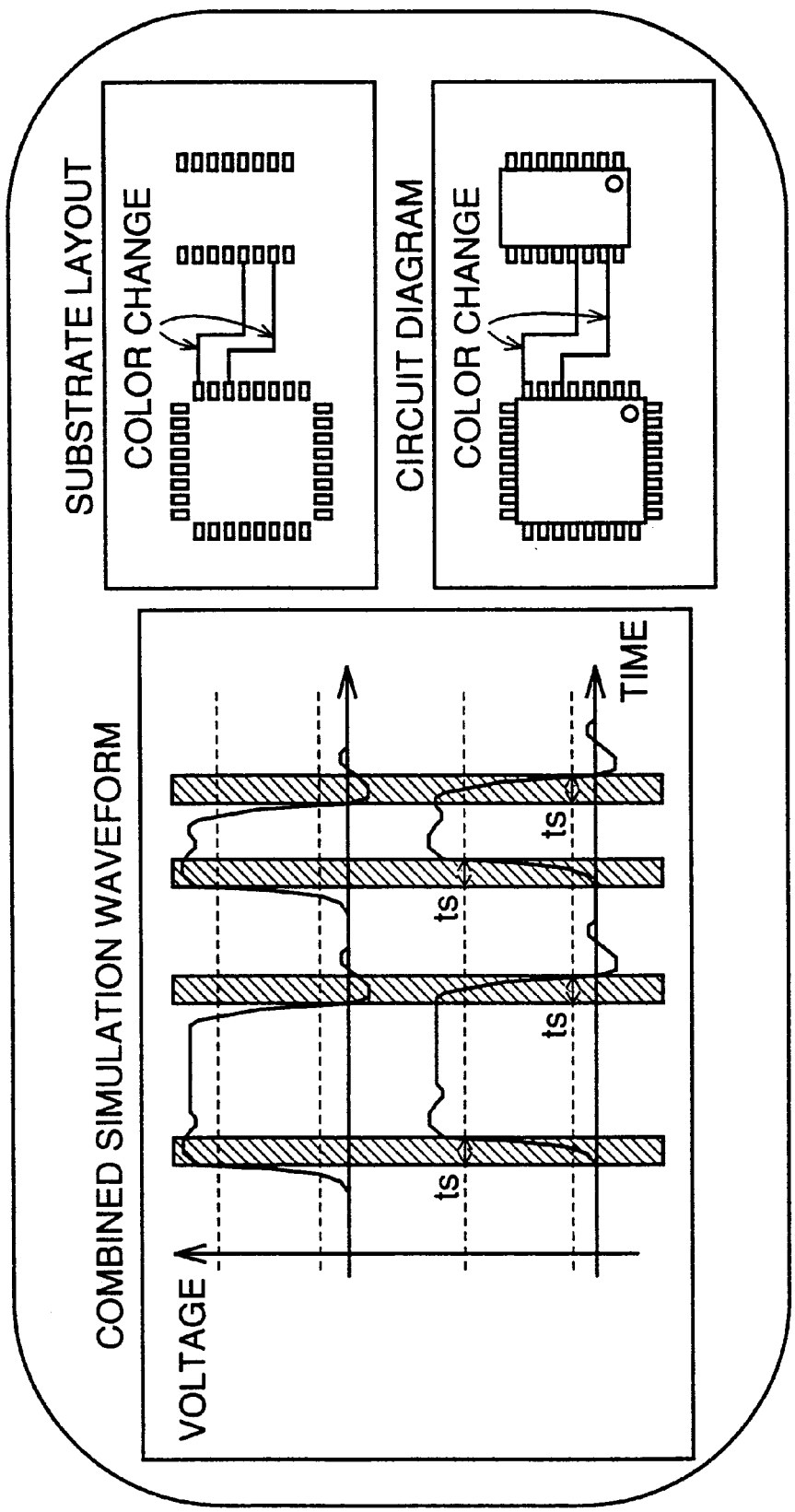
FIG. 25 shows one example of display of an error portion on a graphic display unit 2.

FIG. 22 is a flow chart presented for describing a processing procedure of the simulator of this embodiment. The processing procedure of the eleventh embodiment is different from that of the simulator of the first embodiment shown in FIG. 7 in that steps ST501–ST502 are added. Therefore, a detailed description of the common steps of the processing procedure is not repeated.

Simulation result processing section 82 compares the combined result of the simulation and the result of the timing simulation, and determines if the result of the comparison falls within the range of the comparison rule information held in comparison rule information holding section 81 (ST501). Suppose that comparison rule information holding section 81 stores a comparison rule applied to certain paired pins that "a difference between the timing simulation result and the combined simulation result (delay time) is within 1 ns." If the result of the timing simulation shown in FIG. 23A and the combined simulation result shown in FIG. 23B are obtained, simulation result processing section 82 determines whether each of delay time td1, td2, td3 and td4 is within 1 ns. If any delay time is not within 1 ns, simulation result processing section 82 stores the corresponding portion in error information holding section 83 as error information (ST502). After the simulation is completed, the error information is displayed on result display section 35 (ST110) for informing the user of the error.

Suppose that comparison rule information holding section 81 stores a comparison rule applied to certain paired pins that "a difference between the timing simulation result and overshoot voltage of the combined simulation result is within 0.3V." If the timing simulation result shown in FIG. 23A and the combined simulation result shown in FIG. 23B are obtained, simulation result processing section 82 determines whether overshoot voltage vr1, vr2, vr3 and vr4 are each within 0.3V. If any overshoot voltage is not within 0.3V, simulation result processing section 82 stores the corresponding portion in error information holding section 83 as error information.

Suppose that comparison rule information holding section 81 stores a comparison rule applied to a plurality of transmission lines between paired pins that "delay time (skew) is within 1 ns." If the combined simulation result shown in FIG. 24A and the combined simulation result shown in FIG. 24B are obtained, simulation result processing section 82 determines whether delay time ts1, ts2, ts3 and ts4 are each within 1 ns. If any delay time is not within 1 ns, simulation result processing section 82 stores the corresponding portion in error information holding section 83 as the error information.

The simulator according to this embodiment allows any improper portion on the printed-circuit board to be easily specified by comparing the timing simulation result and the combined simulation result to display error information.

(Twelfth Embodiment)

The simulator of the twelfth embodiment of the invention is different from the simulators of the ninth to the eleventh embodiments only in that result display section 35 has a different function. Therefore, the common structures and functions are not repeatedly described in detail.

For example, result display section 35 displays a waveform of a combined simulation result and a corresponding error portion on graphic display unit 2, and changes the color of the portion corresponding to the error. Further, result display section 35 informs the user of the error portion by displaying the error portion on the printed-circuit board (transmission line or the like) with a different color on the right side of the waveform of the combined simulation result.

The simulator of this embodiment enables the user to easily know any improper portion by simultaneously displaying an error portion at the waveform of the combined simulation result and the error portion at the interconnection line on the printed-circuit board by emphasizing them. Consequently, it becomes possible to efficiently modify the layout diagram and circuit diagram of the printed-circuit board.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A simulator comprising:
   first simulation means for executing simulation for a logic circuit of an electronic component to extract an initial logical operation time at an output terminal of said electronic component from a result of the simulation;
   second simulation means for executing simulation of a transmission line connected to said output terminal based on the initial logical operation time extracted by said first simulation means; and
   verification result combination means for combining part of a waveform generated by said first simulation means and part of a waveform generated by said second simulation means.

2. The simulator according to claim 1, wherein
   said first simulation means executes timing simulation for said logic circuit to extract a logic operation occurring time at said output terminal of said electronic component from a result of the timing simulation for use by said second simulation means as said initial logic operation time.

3. The simulator according to claim 2, further comprising:
   logical operation time extracting means for extracting a logical operation time from the result of the transmission line simulation by said second simulation means; and
   waveform generating means for generating an input waveform for the timing simulation from the logical operation occurring time extracted by said first simulation means and the logical operation time extracted by said logical operation time extracting means.

4. The simulator according to claim 2, further comprising result holding means for holding the result of the transmission line simulation by said second simulation means, wherein
   said second simulation means does not execute simulation of a transmission line between paired pins if said result holding means stores a result of the simulation of the transmission line between the paired pins, and said verification result combination means combines the result of the timing simulation by said first simulation means and the result of the transmission line simulation held by said result holding means.

5. The simulator according to claim 2, further comprising result holding means for holding the result of the transmission line simulation by said second simulation means, wherein said second simulation means executes simulation of all transmission lines between paired pins and stores a result of the simulation in said result holding means, and said verification result combination means combines the result of the timing simulation by said first simulation means and the result of the transmission line simulation held by said result holding means.

6. The simulator according to claim 2, wherein said second simulation means executes simulation of the transmission line by changing a logical threshold value when it executes simulation of the transmission line connected to said output terminal from the logical operation time extracted by said first simulation means.

7. The simulator according to claim 2, further comprising error portion extracting means for extracting a portion of said logical operation time as an error portion where the result of the transmission line simulation by said second simulation means does not go beyond a threshold value.

8. The simulator according to claim 7, further comprising display means for displaying the error portion extracted by said error portion extracting means.

9. The simulator according to claim 2, further comprising error portion extracting means for extracting from the result of the transmission line simulation by said second simulation means a portion of said logical operation time as an error portion where undershoot goes beyond a logical threshold value.

10. The simulator according to claim 9, further comprising display means for displaying the error portion extracted by said error portion extracting means.

11. The simulator according to claim 2, further comprising:

comparison rule holding means for holding a predetermined comparison rule; and error portion extracting means for comparing the result of the timing simulation by said first simulation means and the combined result by said verification result combination means to extract an error portion of the comparison if a result of the comparison is not within a range of the comparison rule held by said comparison rule holding means.

12. The simulator according to claim 11, further comprising display means for displaying the error portion extracted by said error portion extracting means.

13. The simulator according to claim 1, wherein said first simulation means executes a circuit simulation for said logic circuit of said electronic component to extract said initial logical operation time at said output terminal of said electronic component from a result of the circuit simulation.

14. The simulator according to claim 13, further comprising waveform generating means for generating an input waveform for the circuit simulation in a piece wise linear format from the combined result by said verification result combination means.

15. The simulator according to claim 13, further comprising waveform generating means for generating an input waveform for the circuit simulation in a form of voltage control type current source from the combined result by said verification result combination means.

16. A method of simulation comprising the steps of:

executing simulation for a logic circuit of an electronic component to extract an initial logical operation time at an output terminal of said electronic component from a result of the simulation;

executing simulation of a transmission line connected to said output terminal based on said extracted initial logical operation time; and combining part of a waveform generated by the simulation for the logic circuit with part of a waveform generated by the simulation of the transmission line.

17. A medium on which a simulation program is recorded, said simulation program causing execution of the steps:

executing simulation for a logic circuit of an electronic component to extract an initial logical operation time at an output terminal of said electronic component from a result of the simulation;

executing simulation of a transmission line connected to said output terminal based on said extracted initial logical operation time; and combining part of a waveform generated by the simulation for the logic circuit with part of a waveform generated by the simulation of the transmission line.

* * * * *